(12) United States Patent
Tsunomura et al.

(10) Patent No.: US 11,695,012 B2
(45) Date of Patent: Jul. 4, 2023

(54) SEMICONDUCTOR DEVICE AND MANUFACTURING METHOD OF THE SAME

(71) Applicant: Renesas Electronics Corporation, Tokyo (JP)

(72) Inventors: Takaaki Tsunomura, Kanagawa (JP); Yoshiki Yamamoto, Kanagawa (JP); Masaaki Shinohara, Kanagawa (JP); Toshiaki Iwamatsu, Kanagawa (JP); Hidekazu Oda, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 381 days.

(21) Appl. No.: 16/928,542

(22) Filed: Jul. 14, 2020

(65) Prior Publication Data
US 2020/0343268 A1   Oct. 29, 2020

Related U.S. Application Data

(63) Continuation of application No. 16/670,918, filed on Oct. 31, 2019, now Pat. No. 10,756,115, which is a (Continued)

(30) Foreign Application Priority Data

Apr. 9, 2012 (JP) ................................. 2012-088545

(51) Int. Cl.
*H01L 27/12* (2006.01)
*H01L 29/66* (2006.01)
(Continued)

(52) U.S. Cl.
CPC ...... *H01L 27/1203* (2013.01); *H01L 27/1207* (2013.01); *H01L 29/66477* (2013.01); (Continued)

(58) Field of Classification Search
CPC ........................... H01L 27/12; H01L 27/1214
See application file for complete search history.

(56) References Cited

U.S. PATENT DOCUMENTS 6,734,527 B1 * 5/2004 Xiang ............. H01L 21/823807
257/E21.639
8,642,434 B2    2/2014 Liu et al.
(Continued)

FOREIGN PATENT DOCUMENTS

JP    2000-223713 A    8/2000
JP    2003-188274 A    7/2003
(Continued)

OTHER PUBLICATIONS

Office Action dated Feb. 14, 2017, in Japanese Patent Application No. 2016-090227.
(Continued)

*Primary Examiner* — Jae Lee
(74) *Attorney, Agent, or Firm* — McDermott Will & Emery LLP

(57) ABSTRACT

On a semiconductor substrate having an SOI region and a bulk silicon region formed on its upper surface, epitaxial layers are formed in source and drain regions of a MOSFET formed in the SOI region, and no epitaxial layer is formed in source and drain regions of a MOSFET formed in the bulk silicon region. By covering the end portions of the epitaxial layers with silicon nitride films, even when diffusion layers are formed by implanting ions from above the epitaxial layers, it is possible to prevent the impurity ions from being implanted down to a lower surface of a silicon layer.

31 Claims, 12 Drawing Sheets

Related U.S. Application Data continuation of application No. 15/695,410, filed on Sep. 5, 2017, now Pat. No. 10,510,775, which is a continuation of application No. 13/859,297, filed on Apr. 9, 2013, now Pat. No. 9,935,125.

(51) Int. Cl.
*H01L 29/78* (2006.01)
*H01L 21/8234* (2006.01)
*H01L 29/417* (2006.01)
*H01L 21/8238* (2006.01)

(52) U.S. Cl.
CPC ............... *H01L 29/66628* (2013.01); *H01L 29/66651* (2013.01); *H01L 29/7834* (2013.01); *H01L 21/823418* (2013.01); *H01L 21/823814* (2013.01); *H01L 29/41783* (2013.01)

(56) References Cited

U.S. PATENT DOCUMENTS

| | | | |
|---|---|---|---|
| 8,748,275 | B2 | 6/2014 | Thees et al. |
| 2003/0111688 | A1 | 6/2003 | Hokazono et al. |
| 2005/0026367 | A1* | 2/2005 | Streck ............... H01L 29/66636 |
| | | | 257/E29.267 |
| 2005/0035369 | A1 | 2/2005 | Lin et al. |
| 2005/0048732 | A1 | 3/2005 | Park et al. |
| 2006/0157797 | A1 | 7/2006 | Tateshita |
| 2007/0266933 | A1 | 11/2007 | Tsuchiya et al. |
| 2008/0029815 | A1 | 2/2008 | Chen et al. |
| 2009/0321838 | A1 | 12/2009 | Sell et al. |
| 2010/0032761 | A1* | 2/2010 | Ding ..................... H01L 27/088 |
| | | | 257/350 |
| 2010/0084709 | A1 | 4/2010 | Tsuchiya et al. |
| 2010/0176426 | A1 | 7/2010 | Meunier-Bellard et al. |
| 2011/0037125 | A1* | 2/2011 | Cheng ..................... H01L 21/84 |
| | | | 257/E21.135 |
| 2011/0042744 | A1 | 2/2011 | Cheng et al. |
| 2011/0136306 | A1 | 6/2011 | Ariyoshi et al. |
| 2012/0032275 | A1 | 2/2012 | Balasubramanian et al. |
| 2012/0153393 | A1 | 6/2012 | Liang et al. |
| 2012/0223391 | A1 | 9/2012 | Fujita et al. |
| 2013/0049126 | A1 | 2/2013 | Flachowsky et al. |

FOREIGN PATENT DOCUMENTS

| | | |
|---|---|---|
| JP | 2006-135340 A | 5/2006 |
| JP | 2007-513489 A | 5/2007 |
| JP | 2007-220808 A | 8/2007 |
| JP | 2007-311607 A | 11/2007 |
| JP | 2009-076549 A | 4/2009 |
| JP | 2012-004373 A | 1/2012 |
| WO | 2007-004535 A1 | 1/2007 |

OTHER PUBLICATIONS

Office Action dated Mar. 1, 2016, in Japanese Patent Application No. 2012-088545.

Office Action dated Feb. 6, 2018, in Japanese Patent Application No. 2017-079401.

Office Action dated Jun. 4, 2019, in Japanese Patent Application No. 2018-147335.

* cited by examiner

SEMICONDUCTOR DEVICE AND MANUFACTURING METHOD OF THE SAME

CROSS-REFERENCE TO RELATED APPLICATION

The present application claims priority from Japanese Patent Application No. 2012-088545 filed on Apr. 9, 2012, the content of which is hereby incorporated by reference into this application.

TECHNICAL FIELD

The present invention relates to a semiconductor device and a manufacturing method of the same, and in particular to a technique effectively applied to a semiconductor device using an SOI (Silicon On Insulator) substrate and a manufacturing method of the same.

BACKGROUND

At present, as a semiconductor device capable of suppressing the generation of a parasitic capacitance, a semiconductor device with an SOI substrate has been used. The SOI substrate is a substrate in which a BOX (Buried Oxide) film is formed on a support substrate made of Si (silicon) having a high resistance or the like and a thin layer (silicon layer) mainly made of Si (silicon) is formed on the BOX film. In the case when a MOSFET (Metal Oxide Semiconductor Field Effect Transistor: MOS-type field effect transistor) is formed on the SOI substrate, it is possible to reduce a parasitic capacitance generated in a diffusion region formed in the silicon layer. For this reason, by producing a semiconductor device using the SOI substrate, for example, the integration density and operation speed of the semiconductor device can be improved, and the prevention of latch-up can be expected.

Japanese Patent Application Laid-Open Publication No. 2009-076549 (Patent Document 1) describes a structure in which a transistor is formed on each of an SOI layer and a bulk layer on a single semiconductor layer.

International Patent Application Publication WO 2007/004535 Pamphlet (Patent Document 2) describes a structure in which an SOI-type MISFET (Metal Insulator Semiconductor FET) and a bulk-type MISFET are formed on a semiconductor substrate.

Japanese Patent Application Laid-Open Publication No. 2007-311607 (Patent Document 3) describes a structure in which an SOI region and a bulk silicon region are formed in the same substrate, and a MISFET is formed in each of the SOI region and the bulk silicon region.

Japanese Patent Application Laid-Open Publication No. 2006-135340 (Patent Document 4) describes a method in which an n channel type MOSFET and a p channel type MOSFET are formed in a bulk silicon region, and a silicon layer is epitaxially grown in the source and drain regions of one of the MOSFETs by using an insulating film.

SUMMARY

When an SOI region and a bulk silicon region are formed on the same substrate and a MOS-type field effect transistor (hereinafter, referred to simply as MOSFET) is formed on each of the regions, it is conceivable that an epitaxial layer is formed in source and drain regions of the MOSFET in the SOI region and an epitaxial layer is formed also in source and drain regions of the MOSFET in the bulk silicon region. However, when the gate insulating film of the MOSFET in the bulk silicon region is thicker than the gate insulating film of the MOSFET in the SOI region, etching residues from the processing of the gate insulating film sometimes remain in the bulk silicon region, and if an epitaxial layer is formed in the region having the etching residues, the epitaxial layer is not formed desirably.

The above and other objects and novel characteristics of the present invention will be apparent from the description of the present specification and the accompanying drawings.

The following is a brief description of an outline of the typical embodiment disclosed in the present application.

In a semiconductor device according to one embodiment, epitaxial layers are formed in source and drain regions of a MOSFET in an SOI region, and no epitaxial layer is formed on source and drain regions of a MOSFET in a bulk silicon region.

Moreover, in a semiconductor device according to another embodiment, a MOSFET using a thicker gate oxide film and a MOSFET using a thinner gate oxide film are formed in the bulk silicon region, and no epitaxial layer is formed in the source and drain regions of the MOSFET using the thicker gate oxide film.

According to one embodiment disclosed in the present application, it is possible to improve the performances of the semiconductor device. Moreover, it is possible to improve the reliability of the semiconductor device.

DETAILED DESCRIPTION

Hereinafter, embodiments of the present invention will be described in detail with reference to the accompanying drawings. Note that components having the same function are denoted by the same reference symbols throughout the drawings for describing the embodiments, and the repetitive description thereof will be omitted.

First Embodiment

Figure 1:
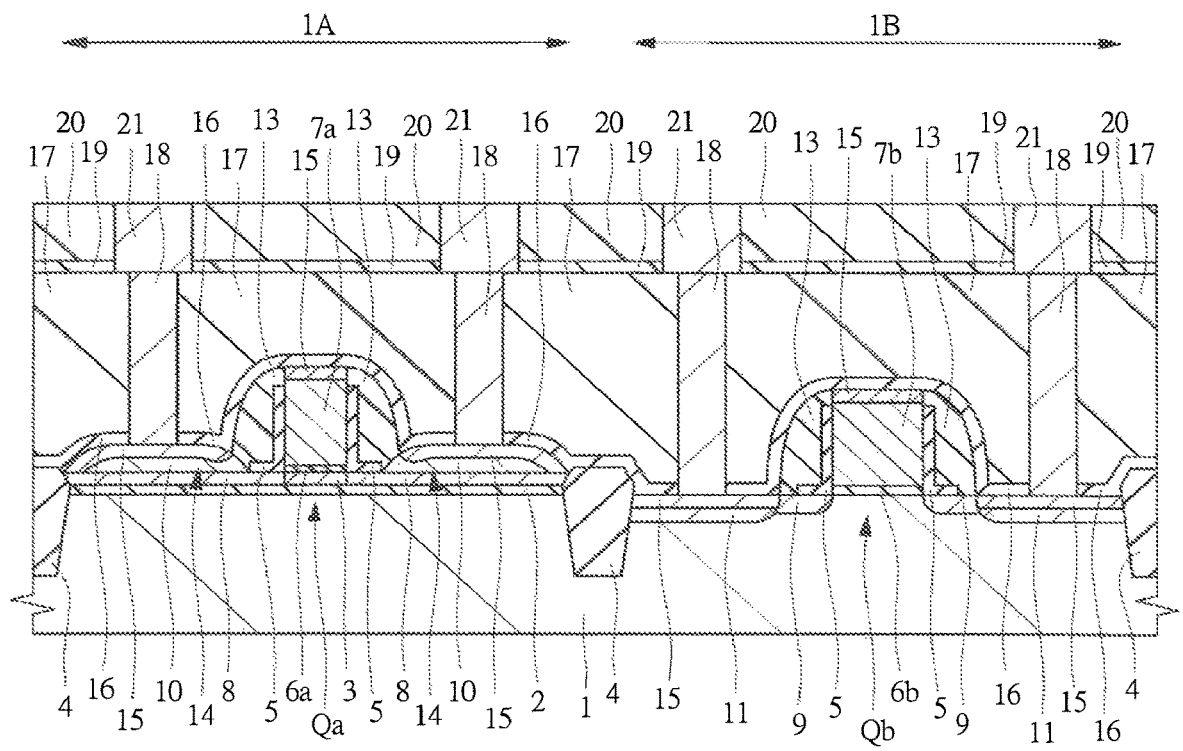
FIG. 1 is a cross-sectional view showing a semiconductor device according to the first embodiment of the present invention.

A MOSFET according to the present embodiment will be described with reference to drawings. FIG. 1 is a cross-sectional view of a semiconductor device according to the present embodiment, that is, a semiconductor device having an n channel type MOSFET formed on an SOI substrate. The left side of the cross-sectional view of FIG. 1 represents an SOI region 1A, and the right side of the cross-sectional view of FIG. 1 represents a bulk silicon region 1B. In the SOI region 1A, a silicon layer (SOI layer, semiconductor layer) 3 is formed on a semiconductor substrate 1 via a BOX film 2 and a MOSFET Qa is formed on the silicon layer 3, and in the bulk silicon region 1B, none of the BOX film (insulating film) 2 and the silicon layer 3 are formed on the semiconductor substrate 1 and a MOSFET Qb is formed on the main surface of the semiconductor substrate 1.

In this case, the MOSFET formed in the SOI region 1A is mainly used for a logic circuit, an SRAM or the like, and corresponds to a MOSFET with a comparatively low withstand voltage. Moreover, the MOSFET formed in the bulk silicon region 1B is mainly used for an I/O circuit or the like, and corresponds to a MOSFET with a comparatively high withstand voltage.

As shown in FIG. 1, the semiconductor device of the present embodiment is provided with the semiconductor substrate 1, and the SOI region 1A and the bulk silicon region 1B separated from each other by an element separation region 4 are provided on the main surface of the semiconductor substrate 1. The semiconductor substrate 1 is a support substrate made of, for example, Si (silicon), and the element separation region 4 is an insulating film made of a silicon oxide film or the like. On the main surface of the semiconductor substrate 1 in the SOI region 1A, the silicon layer 3, which is a semiconductor layer made of single crystal silicon having a resistance of about 1 to 10 Ωcm, is formed via the BOX film 2 made of a silicon oxide film, and one portion of the silicon layer 3 forms a channel region through which an electric current flows at the time of the operation of the MOSFET Qa. The upper surface of the element separation region 4 is positioned at a region higher than the upper surface of the silicon layer 3. Also, the bottom surface of the element separation region 4 reaches a region deeper than the bottom surface of the BOX film 2 corresponding to an intermediate depth of the semiconductor substrate 1.

The MOSFET Qa is formed on the silicon layer 3 in the SOI region 1A. On the silicon layer 3 in the SOI region 1A, a gate electrode (conductor layer) 7a is formed via a gate insulating film (insulating film) 6a, and a sidewall made up of a silicon oxide film 5 and a silicon nitride film 13 is formed in a self-aligned manner on the side wall of the gate electrode 7a. In the silicon layer 3, extension regions 8 which are semiconductor regions to which an n-type impurity (for example, As (arsenic)) is introduced at a comparatively low concentration are formed so as to sandwich the gate electrode 7a when seen in a plan view. More specifically, in the silicon layer 3 on the both sides of the gate electrode 7a, a pair of extension regions 8 is formed. In the silicon layer 3 right below the gate electrode 7a, a region in which no extension region 8 is formed is provided, and this region forms a channel region of the MOSFET Qa.

In the SOI region 1A, on the part of the silicon layer 3 that is not covered with the gate electrode 7a, the gate insulating film 6a, and the silicon oxide film 5, epitaxial layers 14 are formed so as to sandwich the gate electrode 7a. An n-type impurity (for example, As (arsenic)) is introduced into the pair of epitaxial layers 14 formed on the both sides of the gate electrode 7a, thereby forming n-type semiconductor layers constituting diffusion layers 10. Into the diffusion layers 10, the n-type impurity (for example, As (arsenic)) is introduced at a concentration higher than that of the extension regions 8. Of the semiconductor layers on the both sides of the gate electrode 7a, one of the diffusion layers 10 and one of the extension regions 8 constitute a source region of the MOSFET Qa, and the other diffusion layer 10 and the other extension region 8 constitute a drain region of the MOSFET Qa. A case in which the n-type impurity (for example, As (arsenic)) is introduced into the entire regions of the epitaxial layers 14 and the diffusion layers 10 are formed in the corresponding regions is described here, but the impurity may be introduced into a part of the silicon layer 3 below each of the epitaxial layers 14.

The silicon oxide films 5 forming the respective sidewalls that are in contact with side walls on the both sides of the gate electrode 7a include a silicon oxide film that is formed along the side wall of a stacked film made up of the gate electrode 7a and the gate insulating film 6a and a silicon oxide film that is formed along the upper surface of the silicon layer 3, and they have an L-shape cross section along the gate length direction of the gate electrode 7a. Each silicon oxide film 5 is covered with the silicon nitride film 13, and the uppermost surface of the silicon oxide film 5 is positioned at a region lower than the uppermost surface of the silicon nitride film 13.

The epitaxial layer 14 has a film thickness larger than that of the gate insulating film 6a, and the film thickness of the epitaxial layer 14 becomes thinner as being close to the end portion thereof. For example, the epitaxial layer 14 has a smaller thickness in the vicinity of the silicon oxide film 5 adjacent thereto, and at a part of the region apart from the silicon oxide film 5, it has a larger thickness than that of the region in the vicinity of the silicon oxide film 5. More specifically, the epitaxial layer 14 has a dome-like shape whose film thickness is larger in the center portion than in the end portion. Moreover, the epitaxial layer 14 has a film thickness larger than that of the gate insulating film 6a, and since both of the epitaxial layer 14 and the gate insulating film 6a are formed so as to be in contact with the upper surface of the silicon layer 3, the upper surface of the epitaxial layer 14 is higher than the upper surface of the gate insulating film 6a.

Therefore, since the upper surface of the gate insulating film 6a is positioned at a region lower than the upper surface of the diffusion layer 10, the upper surface of the gate insulating film 6a is lower than the upper surface of the source and drain regions of the MOSFET Qa. In other words, in the MOSFET Qa in the SOI region 1A, the upper surface of the source and drain regions is positioned at a region higher than the interface between the gate insulating film 6a and the silicon layer 3. In this case, the upper surface of the source and drain regions mentioned here refers to a position having the largest upper surface height in the source and drain regions made up of the extension regions 8 and the diffusion layers 10 in the SOI region 1A.

In contrast, in the MOSFET Qb in the bulk silicon region 1B, the upper surface of the source and drain regions is as high as or lower than the interface between the gate insulating film 6b and the semiconductor substrate 1. The reason why the upper surface of the source and drain regions of the MOSFET Qb, that is, the uppermost surface of the n-type semiconductor layer including the diffusion layer 11 is as high as or lower than the interface between the gate insulating film 6b and the semiconductor substrate 1 is that the above-mentioned source and drain regions are formed by implanting impurity ions into the semiconductor substrate 1. Additionally, the reason why the upper surface of the source and drain regions of the MOSFET Qb is lower than the interface between the gate insulating film 6b and the semiconductor substrate 1 is that the exposed upper surface of the semiconductor substrate 1 is recessed in some cases due to an etching process at the time of patterning the gate insulating film 6b or the like, an ion implanting process at the time of forming the diffusion layer 11, a cleaning process of the surface of the semiconductor substrate 1, and the like.

Herein, the upper surface of one portion of the end portion of the epitaxial layer 14 in a region adjacent to the silicon oxide film 5 is covered with the silicon nitride film 13 constituting the sidewalls. In other words, the upper surface of the end portion of the epitaxial layer 14 on the gate electrode 7a side is covered with the insulating film.

The above-mentioned MOSFET Qa is a field effect transistor having a channel region made up of the silicon layer 3, the gate electrode 7a, and source and drain regions including the extension regions 8 and the diffusion layers 10.

Moreover, in the bulk silicon region 1B, the MOSFET Qb including no epitaxial layer is formed on the semiconductor substrate 1 having no SOI structure formed thereon. More specifically, the MOSFET Qb in the bulk silicon region 1B has a channel region made up of one portion of the upper surface of the semiconductor substrate 1 and source and drain regions formed by implanting an impurity into the upper surface of the semiconductor substrate 1. On the upper surface of the semiconductor substrate 1, the gate insulating film (insulating film) 6b is formed so as to be in contact therewith, and on the semiconductor substrate 1, the gate electrode (conductor layer) 7b is formed via the gate insulating film 6b. Moreover, on side walls of the gate electrode 7b, sidewalls each made up of the silicon oxide film 5 and the silicon nitride film 13 are formed in a self-aligned manner.

On the upper surface of the semiconductor substrate 1, extension regions 9 which are semiconductor regions to which an n-type impurity (for example, As (arsenic)) is introduced at a comparatively low concentration are formed so as to sandwich the gate electrode 7b when seen in a plan view. More specifically, on the upper surface of the semiconductor substrate 1, on the both sides of the gate electrode 7b in the gate length direction, a pair of extension regions 9 is formed. On the upper surface of the semiconductor substrate 1 right below the gate electrode 7b, a region in which no extension region 9 is formed, and this region serves as a channel region of the MOSFET Qb.

On the part of the upper surface of the semiconductor substrate 1 that is not covered with the gate electrode 7b, the gate insulating film 6b, the silicon oxide film 5, and the silicon nitride film 13 in the bulk silicon region 1B, diffusion layers 11 which are semiconductor layers to which an n-type impurity (for example, As (arsenic)) is introduced at a comparatively high concentration are formed. Into the diffusion layers 11, the n-type impurity (for example, As (arsenic)) is introduced at a concentration higher than that of the extension regions 9, and the diffusion layers 11 have a junction depth deeper than that of the extension regions 9. Of the semiconductor layers on the both sides of the gate electrode 7b, one of the diffusion layers 11 and one of the extension regions 9 constitute a source region of the MOSFET Qb, and the other diffusion layer 11 and the other extension region 9 constitute a drain region of the MOSFET Qb.

The silicon oxide films 5 constituting the respective sidewalls that are in contact with side walls on the both sides of the gate electrode 7b include a silicon oxide film that is formed along the side wall of a stacked film made up of the gate electrode 7b and the gate insulating film 6b and a silicon oxide film that is formed along the upper surface of the silicon layer 3, and they have an L-shape cross section along the gate length direction of the gate electrode 7b. Each silicon oxide film 5 is covered with the silicon nitride film 13, and the uppermost surface of the silicon oxide film 5 is positioned at a region lower than the uppermost surface of the silicon nitride film 13. Both of the gate electrodes 7a and 7b are made of, for example, a polysilicon film.

The MOSFET Qb is a field effect transistor having a channel region made up of one portion of the upper surface of the semiconductor substrate 1, the gate electrode 7b, and source and drain regions including the extension regions 9 and the diffusion layers 11. Additionally, the gate insulating film 6b has a film thickness larger than that of the gate insulating film 6a, and the gate electrode 7b is formed to have a gate length larger than that of the gate electrode 7a. Here, since the source and drain regions of the MOSFET Qb in the bulk silicon region 1B do not have any epitaxial layer and are formed in the semiconductor substrate 1, the upper surface of the source and drain regions is lower than the upper surface of the gate insulating film 6b.

Examples of the film thicknesses of the respective layers in the semiconductor device formed in the present embodiment are shown below. For example, the film thickness of the BOX film 2 is 10 to 20 nm, the film thickness of the silicon layer 3 is 10 to 20 nm, the film thickness of the gate insulating film 6a is 2 to 3 nm, the film thickness of the silicon oxide film 5 is 10 to 20 nm, the film thickness of each of the gate electrodes 7a and 7b is 100 to 140 nm, and the film thickness of the gate insulating film 6b is 3 to 8 nm. Moreover, the film thickness of the diffusion layer 10 shown in FIG. 1, that is, the film thickness of the epitaxial layer 14 is, for example, 20 to 60 nm. As described above, the film thickness of the epitaxial layer 14 is larger than the film thickness of the gate insulating film 6a. Additionally, although it is conceivable that there is a case where the film thicknesses of the gate insulating film 6a and the gate insulating film 6b are almost equal to each other, the case where the film thickness of the gate insulating film 6b is larger than that of the gate insulating film 6a is described here.

The above-mentioned film thicknesses indicate values of the film thicknesses in a direction perpendicular to the main surface of the semiconductor substrate 1 in the regions in which the respective layers extend along the main surface of the semiconductor substrate 1. With respect to the layers that extend along the side walls of the gate electrode 7a or 7b, the film thicknesses in a direction along the main surface of the semiconductor substrate 1 are described as follows. That is, the film thickness of the silicon oxide film 5 is 10 to 20 nm, and the film thickness of the silicon nitride film 13 is 40 to 60 nm.

Moreover, on the respective upper surfaces of the diffusion layers 10, the diffusion layers 11, and the gate electrodes 7a and 7b that are not covered with the silicon nitride film 13, silicide layers 15 are formed. Each of the silicide layers 15 is mainly made of, for example, $CoSi_2$ (cobalt silicide). Also, in addition to the cobalt silicide, titanium silicide, nickel silicide, or platinum silicide may be used. The silicide layer 15 reduces the contact resistance of the gate electrodes 7a and 7b and the diffusion layers 10 and 11 relative to contact plugs 18 formed thereon.

An insulating film (etching stopper film) 16 is formed on the silicide layer 15, the silicon nitride film 13, and the element separation region 4 so as to cover the respective surfaces thereof, and an interlayer insulating film 17 having a film thickness larger than that of the insulating film 16 is formed on the insulating film 16. In a stacked film made up of the insulating film 16 and the interlayer insulating film 17, a plurality of contact holes (connection holes) through which the upper surface of the silicide layer 15 is exposed are formed so as to penetrate the stacked film from the upper surface to the lower surface. A contact plug 18 mainly made of, for example, W (tungsten) is formed in each of the plurality of contact holes. The contact plug 18 is a connection member having a pillar shape.

On the interlayer insulating film 17 and the contact plugs 18, wirings 21 prepared as a pattern of a metal film electrically connected to the contact plugs 18 are formed. The wirings 21 are metal wirings for use in supplying a predetermined electric potential to the respective source regions, drain regions, and gate electrodes 7a and 7b of the MOSFETs Qa and Qb, and mainly contain, for example, Cu (copper). Additionally, FIG. 1 does not illustrate the contact plugs 18 and wirings 21 connected to the gate electrodes 7a and 7b. The wirings 21 are damascene wirings formed in wiring trenches that penetrate the stacked film made up of an insulating film (etching stopper film) 19 and an interlayer insulating film 20 that are sequentially stacked on the interlayer insulating film 17. For example, the insulating films 16 and 19 are made of silicon nitride films, the interlayer insulating film 17 is made of a silicon oxide film, and the interlayer insulating film 20 is made of SiOC.

As described above, the SOI region 1A and the bulk silicon region 1B are provided on the semiconductor substrate 1 constituting the semiconductor device of the present embodiment, and MOSFETs suitable for the respective regions are formed on the SOI region 1A and the bulk silicon region 1B. More specifically, in the SOI region 1A, by forming a low withstand voltage MOSFET Qa for which a high-speed signal processing function is required, effects such as the improvement of the element integration density in the SOI region 1A, the reduction of the power consumption, and the improvement of the operation speed can be obtained. These advantages can be obtained because of a small value of an electric current flowing through the MOSFET Qa.

However, the MOSFET Qa constituting the circuits formed in the SOI region 1A has a problem in that the withstand voltage between the source and drain is low due to a parasitic bipolar effect. Therefore, it is necessary for the high withstand voltage MOSFET Qb that handles a high voltage to be formed on a thick bulk silicon film (semiconductor substrate 1) that does not have the SOI structure. For the above-mentioned reasons, the MOSFET Qb for which a withstand voltage higher than that of the MOSFET Qa is required is formed in the bulk silicon region 1B because the MOSFET Qb is difficult to operate normally if it is formed in the SOI region 1A.

In this case, the source and drain regions constituting the MOSFET Qa of the SOI region 1A include the epitaxial layers 14 formed on the silicon layer 3 so as to be raised therefrom. The reason why these epitaxial layers 14 are formed in the SOI region 1A will be described below.

In the case when the ion implantation is carried out to the surface of the semiconductor layer at a high concentration for the purpose of forming the diffusion layers constituting the source and drain regions of the MOSFET, the semiconductor layer in a region where the impurity ions are implanted is damaged and amorphized (non-crystallized). In the case when the amorphized semiconductor layer is directly used for the source and drain regions of the MOSFET, problems such as an increase in the resistance value of the source and drain regions occur, and therefore, it is necessary to crystallize the amorphized semiconductor layer. As the method for crystallizing the semiconductor layer amorphized due to the ion implantation, for example, the method of recovering the crystallinity of the amorphous semiconductor layer by, for example, applying heat thereto can be adopted.

At this time, when the region amorphized due to the damage from the ion implantation is only the upper surface of the silicon layer, by carrying out a heating (annealing) process, the amorphous silicon layer recovers its crystallinity and is crystallized with using a silicon single crystal, which is located in a lower portion and has not been damaged, as a core. For example, even when impurity ions are implanted into the upper surface of a semiconductor layer having a large film thickness like the semiconductor substrate 1, the portion of the semiconductor layer that is amorphized due to the damage from the ion implantation is limited only to the upper surface of the semiconductor substrate 1. Therefore, since a single crystal silicon layer remains inside the semiconductor substrate 1 in the lower portion of the damaged region, the crystallinity of the damaged region can be recovered by carrying out the annealing process with using the single crystal silicon layer as a growing core.

However, since the silicon layer 3 in the SOI region 1A as shown in FIG. 1 is a very thin layer of, for example, about 1 to 20 nm, in the case when an ion implantation at a high concentration is directly carried out to the exposed upper surface of the silicon layer 3 to form the diffusion layer, the silicon layer 3 is amorphized from the upper surface down to the lower surface. In this case, since no semiconductor layer in a crystalline state is in contact with the lower portion of the amorphized region, no core for use in recovering its crystallinity exists, and it is not possible to sufficiently crystallize the amorphous layer so as to recover from the damage even if the heating process is carried out.

For this reason, it is conceivable that the epitaxial layers 14 are formed in the SOI region 1A so as to increase the film thickness of the semiconductor layers used to form the diffusion layers of the source and drain regions. By this means, the film thickness of the semiconductor layer to which ions are implanted so as to form the diffusion layer 10 is increased, thereby limiting the amorphized region only to the upper surface of the semiconductor layer. Thus, the amorphous layer is crystallized by applying heat with using a silicon single crystal located in its lower portion as a core, so that it is possible to recover from the damage.

In other words, the purpose for forming the epitaxial layers 14 in the MOSFET Qa of the SOI region 1A is to prevent damages caused by the ion implantation process from remaining in the diffusion layers 10 even when an ion implantation method or the like is carried out so as to form the diffusion layers 10 constituting the source and drain regions.

In contrast, in the case when the epitaxial layer is formed in the MOSFET in the bulk silicon region 1B, electrical characteristics fluctuate in comparison with the MOSFET having no epitaxial layer formed therein, and variations occur among the plurality of MOSFETs. The MOSFET Qb to be formed in the bulk silicon region 1B is a MOSFET having a higher withstand voltage in comparison with the MOSFET Qa formed in the SOI region 1A, and the film thickness of the gate insulating film 6b of the MOSFET Qb is sometimes larger than the film thickness of the gate insulating film 6a of the MOSFET Qa. In this case, when patterning the gate insulating film 6b by an etching method or the like, since residues from the gate insulating film 6b tend to remain on the surface of the semiconductor substrate 1, if the epitaxial layer is formed on the upper surface of the semiconductor substrate 1 with the residues remaining thereon, the epitaxial layer fails to uniformly grow due to the presence of the residues. In this manner, in the case of the MOSFETs including epitaxial layers which are not uniform in height or film quality in the source and drain regions, variations in characteristics tend to occur among the plurality of MOSFETs.

In the present embodiment, the epitaxial layer is not formed in the bulk silicon region 1B in which the gate insulating film 6b that is thicker than the gate insulating film 6a of the SOI region 1A is formed, so that it becomes possible to prevent the occurrence of the variations in characteristics of the MOSFET Qb. Consequently, it is possible to improve performances of the semiconductor device. Moreover, the reliability of the semiconductor device can be improved. In this manner, in the present embodiment, it is possible to form MOSFETs respectively suitable for the SOI region 1A and the bulk silicon region 1B on the same substrate. Moreover, the epitaxial layers 14 are formed in the MOSFET Qa in the SOI region 1A and no epitaxial layer is formed in the MOSFET Qb in the bulk silicon region 1B, so that it is possible to improve performances of the respective MOSFETs.

In this case, in the SOI region 1A, the epitaxial layer 14 including the diffusion layer 10 has a dome-like shape whose film thickness is smaller in the end portion than in the center portion. As described earlier, the epitaxial layers 14 are formed so as to enable the recovery from damages due to the impurity implantation by increasing the film thickness of the source and drain regions of the MOSFET Qa. However, when the film thickness of the end portion of the epitaxial layer 14 is small, impurity ions implanted by the implanting process to form the diffusion layer 10 sometimes reach the bottom surface of the silicon layer 3 right below the end portion of the epitaxial layer 14. In this case, one portion of the silicon layer 3 is amorphized from the upper surface down to the bottom surface, with the result that the recovery of crystallinity may be difficult.

In particular, in the case when sidewalls on the side walls of the gate electrode 7a are formed only in a region closer to the gate electrode 7a relative to the epitaxial layers 14 and the sidewalls are not overlapped with the epitaxial layers 14 when seen in a plan view, since the epitaxial layers 14 are not covered with the side walls, the silicon layer 3 located right below the end portion of the epitaxial layer 14 on the gate electrode 7a side is amorphized by the ion implantation. In this case, even in an attempt to recover crystallinity of the amorphized silicon layer by carrying out an annealing process, since no silicon single crystal to be a growing core of crystal remains in the vicinity of the silicon layer 3 right below the end portion of the epitaxial layer 14, it might be difficult to sufficiently recover the crystallinity of the silicon layer 3. The MOSFET including the silicide layer 3 like this tends to cause the problems of the increase in a resistance value between the source and drain regions and the occurrence of variations in electrical characteristics such as the on-current value.

In contrast, in the semiconductor device of the present embodiment, as shown in FIG. 1, the silicon nitride films 13 constituting the sidewalls of the gate electrode 7a overlap the portions right above the end portions of the epitaxial layers 14 with a small film thickness. More specifically, the upper surface of the region of the end portion of the epitaxial layer 14 with a small film thickness is covered with the silicon nitride film 13, and the silicon nitride film 13 overlaps the epitaxial layer 14 when seen in a plan view. For this reason, during the ion implantation process for forming the diffusion layer 10, the silicon nitride film 13 serves as a mask, so that it is possible to prevent the direct implantation of impurity ions into the upper surface of the end portion of the epitaxial layer 14 corresponding to a region with a small film thickness.

Therefore, impurity ions are not excessively implanted to the silicon layer 3 right below the end portion of the epitaxial layer 14 closer to the gate electrode 7a, and it is possible to prevent the amorphization ranging from the upper surface down to the lower surface of the silicon layer 3. Thus, since the crystallinity of the silicon layer 3 and the epitaxial layer 14 can be easily recovered and the degradation in the electrical characteristics and the variations in electrical characteristics of the MOSFETs can be prevented, it becomes possible to improve performances of the semiconductor device.

As described above, the semiconductor device according to the present embodiment is characterized by including, on one semiconductor substrate 1, the MOSFET Qb which includes no epitaxial layer and is formed in the bulk silicon region 1B and the MOSFET Qa which is provided with source and drain regions having the epitaxial layers 14 and is formed in the SOI region 1A. Moreover, the semiconductor device according to the present embodiment is characterized in that the upper surface of the end portion of the epitaxial layer 14 on the gate electrode 7a side of the MOSFET Qa is covered with the sidewall of the gate electrode 7a.

Next, the manufacturing processes of a MOSFET according to the present embodiment will be described with reference to drawings. FIGS. 2 to 13 are cross-sectional views showing manufacturing processes of a semiconductor device according to the present embodiment, that is, the semiconductor device provided with an n channel type MOSFET in each of the SOI region and the bulk silicon region.

Figure 2:
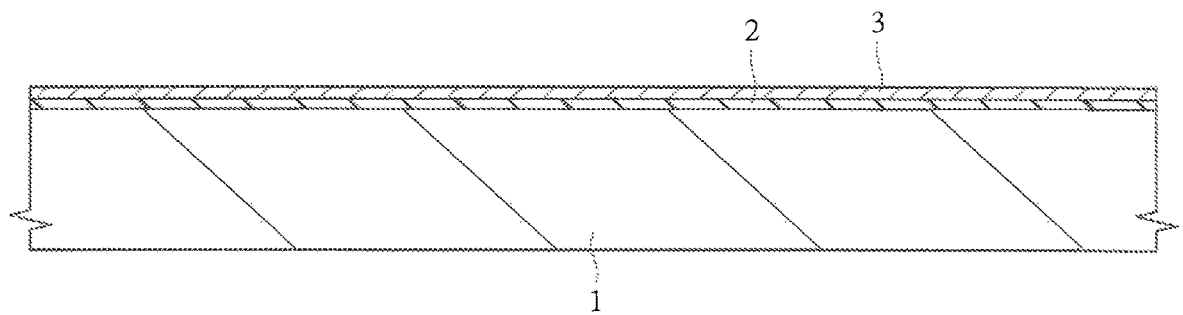
FIG. 2 is a cross-sectional view showing a manufacturing method of the semiconductor device according to the first embodiment of the present invention.

First, as shown in FIG. 2, a semiconductor substrate 1 on which a BOX film 2 and a silicon layer (SOI layer) 3 have been stacked is prepared. The semiconductor substrate 1 is a support substrate made of Si (silicon), and the BOX film 2 on the semiconductor substrate 1 is a silicon oxide film having a film thickness of, for example, 10 to 20 nm. The silicon layer 3 on the BOX film 2 has a resistance in a range from 1 to 10 Ωcm and is made of single crystal silicon with a film thickness of, for example, 10 to 20 nm.

An SOI substrate made up of the semiconductor substrate 1, the BOX film 2, and the silicon layer 3 can be formed by a SIMOX (Silicon Implanted Oxide) method in which $O_2$ (oxygen) ions are implanted into the main surface of the semiconductor substrate 1 made of Si (silicon) with a high energy and Si (silicon) and oxygen are then bonded to each other by the thermal treatment, thereby forming a buried oxide film (BOX film) at a position slightly deeper than the surface of the semiconductor substrate. Moreover, the SOI substrate can be formed also by the processes in which a semiconductor substrate 1 on the surface of which an oxide film is formed and another sheet of a semiconductor substrate made of Si (silicon) are bonded and adhered to each other by applying high temperature and pressure, and then the silicon layer on one side is reduced in thickness.

Figure 3:
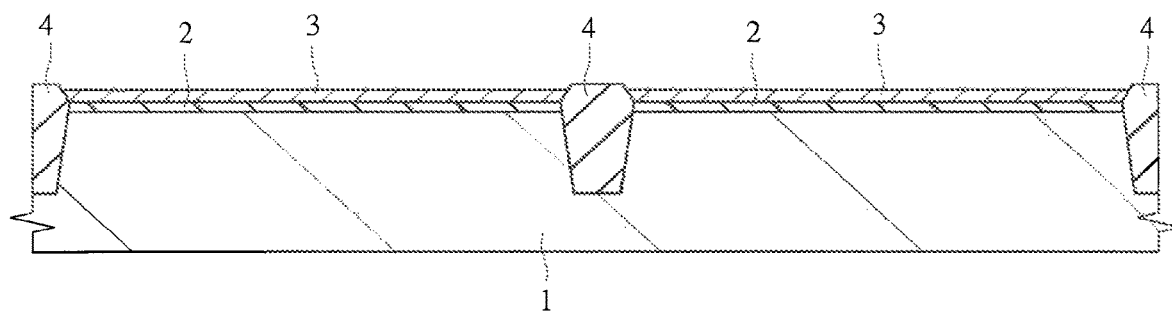
FIG. 3 is a cross-sectional view showing the manufacturing method of the semiconductor device continued from FIG. 2.

Next, as shown in FIG. 3, an element separation region 4 which is made of an insulating film and penetrates the silicon layer 3 and the BOX film 2 to reach the intermediate depth of the semiconductor substrate 1 is formed by using a conventionally known STI (Shallow Trench Isolation) method.

More specifically, after dry etching processes are sequentially carried out to the silicon layer 3, the BOX film 2, and the semiconductor substrate 1 with using a photoresist film (not shown) as an etching mask, thereby forming trenches (trenches for element separation) in the semiconductor substrate 1 in a region where the element separation region is to be formed, an ashing process is carried out to remove the photoresist film R1. Subsequently, on the main surface of the semiconductor substrate 1 including the inside (side wall and bottom portion) of the trench, for example, two layers of insulating films are stacked, thereby burying the inside of the trench. The materials of these stacked insulating films are, for example, silicon oxide films, and these are formed (deposited) by using a CVD (Chemical Vapor Deposition) method or the like. Thereafter, the stacked insulating films are polished by a CMP (Chemical Mechanical Polishing) method to expose the upper surface of the silicon layer 3, thereby forming the element separation region (element separation) 4 made up of the stacked insulating films.

Note that, as shown in FIG. 3, the element separation region 4 made up of the stacked insulating films is indicated as one layer of a film. Moreover, although the element separation region 4 is formed by the STI method in the description of the present embodiment, this may be formed by an LOCOS (Local Oxidization of Silicon) method.

Although not shown in the drawings, after the element separation region 4 has been formed, a p-type impurity (for example, B (boron)) is implanted into the semiconductor substrate 1 by an ion implantation method at a comparatively low concentration, thereby forming p-type wells in the semiconductor substrate 1. The p-type well is formed for the purpose of, for example, adjusting threshold values of a MOSFET Qa to be formed on the silicon layer 3 and a MOSFET Qb to be formed on the semiconductor substrate 1 in the subsequent processes.

Figure 4:
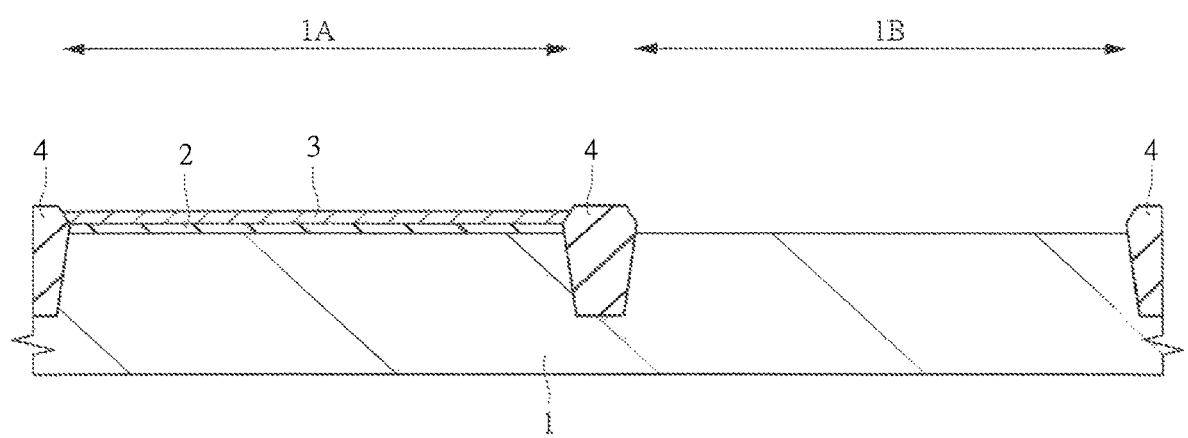
FIG. 4 is a cross-sectional view showing the manufacturing method of the semiconductor device continued from FIG. 3.

Next, as shown in FIG. 4, a photoresist film (not shown) which covers the upper surface of one portion of the silicon layer 3 specified by the element separation region 4 is formed. Next, the silicon layer 3 and the BOX film 2 not covered with the photoresist film are removed by, for example, a wet-etching method using the photoresist film as a mask, thereby exposing the upper surface of the semiconductor substrate 1. Thereafter, the photoresist film is removed.

In this manner, on the semiconductor substrate 1 in the region covered with the photoresist film, a stacked film made up of the BOX film 2 and the silicon layer 3 is left. In the present embodiment, the region having the SOI structure in which the BOX film 2 and the silicon layer 3 are formed is referred to as an SOI region 1A. In FIG. 4, the SOI region 1A is shown on the left side of the drawing.

Moreover, in the above-mentioned etching process, on the semiconductor substrate 1 in the region not covered with the photoresist film, none of the BOX film 2 and the silicon layer 3 are formed, so that the upper surface of the semiconductor substrate 1 is exposed. In the present embodiment, the region in which none of the BOX film 2 and the silicon layer 3 are formed and the bulk silicon forming the upper surface of the semiconductor substrate 1 is exposed is referred to as a bulk silicon region 1B. In FIG. 4, the bulk silicon region 1B is shown on the right side of the drawing.

Figure 5:
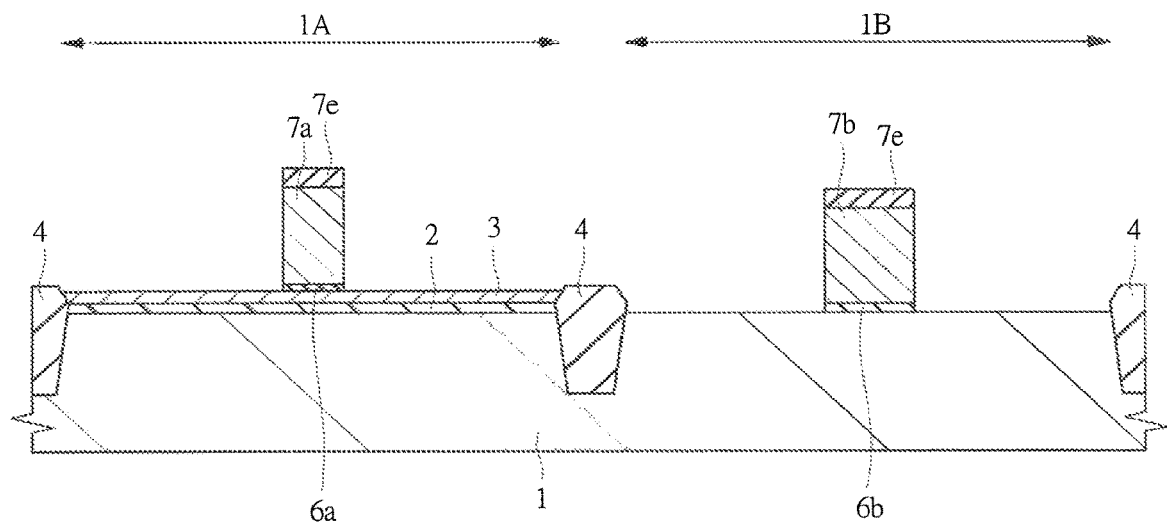
FIG. 5 is a cross-sectional view showing the manufacturing method of the semiconductor device continued from FIG. 4.

Next, as shown in FIG. 5, a gate electrode 7a and a silicon nitride film 7e are sequentially formed on the silicon layer 3 of the SOI region 1A via a gate insulating film 6a, and a gate electrode 7b and a silicon nitride film 7e are sequentially formed on the semiconductor substrate 1 of the bulk silicon region 1B via a gate insulating film 6b. For example, the film thickness of the gate insulating film 6a is about 2 to 3 nm, and the film thickness of the gate insulating film 6b is about 3 to 8 nm. The film thickness of each of the gate electrodes 7a and 7b is, for example, about 100 to 140 nm. The structure in which the film thickness of the gate insulating film 6a is smaller than the film thickness of the gate insulating film 6b is described here.

One example of the method for forming two types of gate insulating films as described above is shown below. In an example of such method, after a silicon oxide film is formed on the entire surface of the semiconductor substrate 1 by using a thermal oxidation method, the silicon oxide film in the SOI region 1A is removed, and subsequently, a silicon oxide film is formed in the SOI region 1A by using the thermal oxidation method. By this means, a silicon oxide film is formed in the SOI region 1A, and a silicon thermal oxide film having a film thickness larger than that is formed in the bulk silicon region 1B. Thereafter, a polysilicon film (conductor film for a gate electrode) and a silicon nitride film are sequentially formed (deposited) on the entire surface of the semiconductor substrate 1 by using a CVD method or the like.

Subsequently, after the silicon nitride film, the polysilicon film, and the silicon oxide film are patterned by using a photolithography technique and a dry etching method, a cleaning process is carried out so as to remove residues and the like.

Thus, the gate insulating film 6a made of the silicon oxide film in the SOI region 1A is formed on the silicon layer 3 in the SOI region 1A, and the gate electrode 7a made of the polysilicon film is formed thereon. Moreover, the gate insulating film 6b made of the silicon oxide film in the bulk silicon region 1B is formed on the semiconductor substrate 1 in the bulk silicon region 1B, and the gate electrode 7b made of the polysilicon film is formed thereon. On the upper surfaces of the respective gate electrodes 7a and 7b, silicon nitride films (hard masks) 7e having a film thickness of, for example, 20 to 40 nm are formed. In this manner, the gate insulating films 6a and 6b having different film thicknesses can be respectively formed in the SOT region 1A and the bulk silicon region 1B. Note that the silicon nitride film 7e has a function of preventing the formation of an epitaxial layer on the upper portion of the gate electrode 7a in the following epitaxial growth process.

In this case, the gate insulating film 6a and the gate insulating film 6b to be thin films are formed by using a thermal oxidation method, but these may be formed by using a CVD method.

Here, the polysilicon films constituting the gate electrodes 7a and 7b are prepared as n-type semiconductor films (doped polysilicon films) having a low resistance by, for example, implanting an n-type impurity such as P (phosphorous) or As (arsenic) thereto. Moreover, the polysilicon film may be formed by changing an amorphous silicon film into a polycrystalline silicon film by the thermal treatment after the film formation (after the ion implantation).

Moreover, by the etching process for forming the gate electrodes 7a and 7b and the gate insulating films 6a and 6b or by the cleaning process for removing the etching residues or the like carried out thereafter, the upper surface of the silicon layer 3 and the upper surface of the semiconductor substrate 1 are sometimes recessed in a downward direction, that is, in the direction toward a rear surface of the semiconductor substrate 1. In this case, the exposed upper surfaces of the semiconductor substrate 1 located on the both sides thereof become lower in comparison with the upper surface of the unexposed semiconductor substrate 1 corresponding to the interface between the semiconductor substrate 1 and the gate insulating film 6b.

Figure 6:
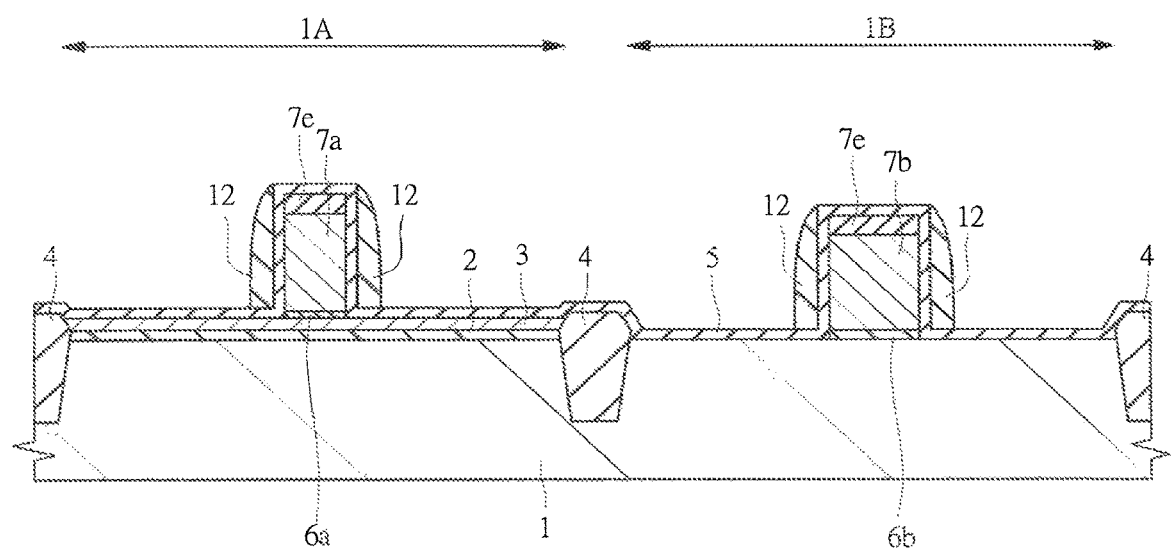
FIG. 6 is a cross-sectional view showing the manufacturing method of the semiconductor device continued from FIG. 5.

Next, as shown in FIG. 6, a silicon oxide film (insulating film) 5 and a silicon nitride film 12 are sequentially formed by, for example, a CVD method so as to cover the entire surface of the semiconductor substrate 1 including the gate electrodes 7a and 7b. The film thickness of the silicon oxide film 5 is set to, for example, 10 to 20 nm, and the film thickness of the silicon nitride film 12 is set to, for example, 20 to 40 nm. Thereafter, by partly removing the silicon nitride film 12 by, for example, an anisotropic etching method such as an RIE (Reactive Ion Etching) method or the like, the upper surface of the silicon oxide film 5 is exposed, so that the silicon nitride film 12 formed into a sidewall shape is left on each of the side walls of the gate electrodes 7a and 7b in a self-aligned manner via the silicon oxide film 5. In this case, the surfaces of the silicon layer 3, the semiconductor substrate 1, the element separation region 4, the gate electrodes 7a and 7b, and the silicon nitride film 7e are covered with the silicon oxide film 5. The silicon nitride film 12 is a dummy sidewall that is removed in a subsequent process and is not left at the time of completion of the semiconductor device.

Figure 7:
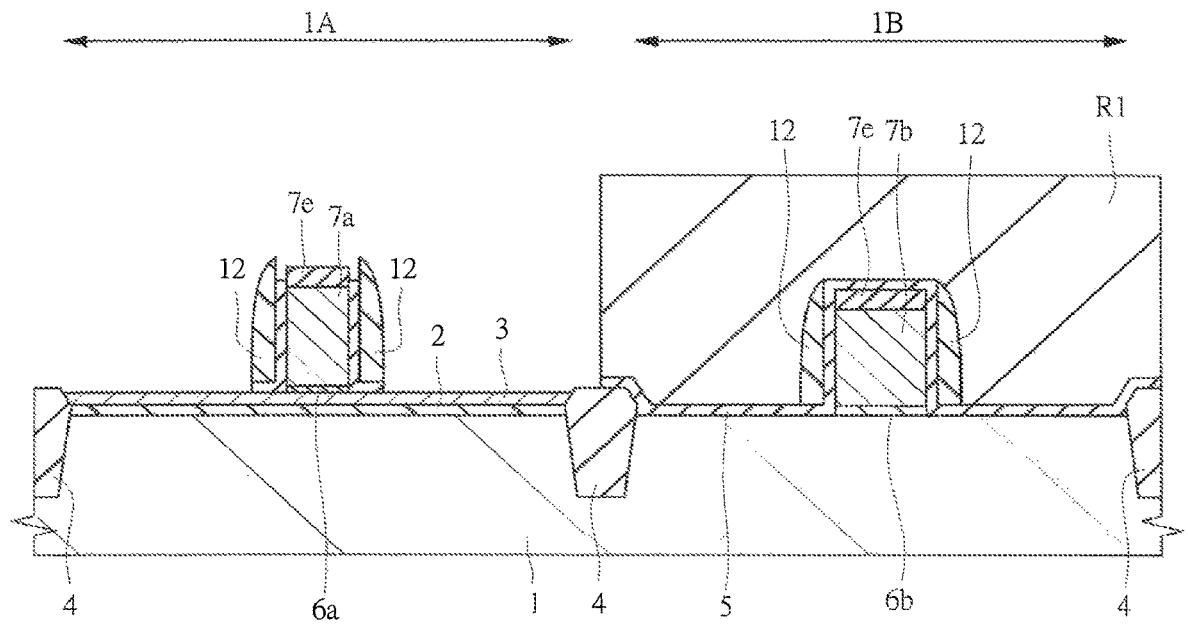
FIG. 7 is a cross-sectional view showing the manufacturing method of the semiconductor device continued from FIG. 6.

Next, as shown in FIG. 7, the bulk silicon region 1B is covered with a photoresist film R1, and then, the silicon oxide film 5 not covered with the silicon nitride film 12 is removed by using a selective dry etching method. In this manner, the silicon oxide film 5 of the SOI region 1A is left in a region between the gate electrode 7a and the silicon nitride film 12 and in a region between the silicon layer 3 and the silicon nitride film 12, and the upper surface of the silicon layer 3 and the upper surface of the silicon nitride film 7e in the SOI region 1A are exposed. Since this etching process is carried out with using the photoresist film R1 as a mask, the silicon oxide film 5 covered with the photoresist film R1 in the bulk silicon region 1B is not removed.

Figure 8:
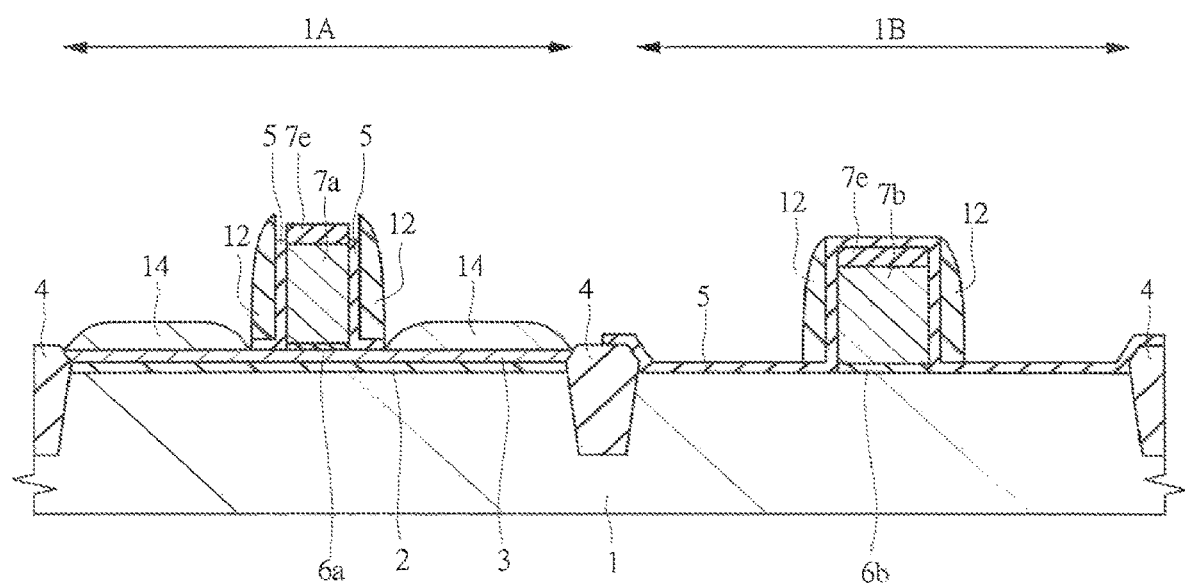
FIG. 8 is a cross-sectional view showing the manufacturing method of the semiconductor device continued from FIG. 7.

Next, as shown in FIG. 8, after the photoresist film R1 is removed by the ashing process, epitaxial layers 14 are formed on the upper surface of the silicon layer 3 exposed on the semiconductor substrate 1 by using an epitaxial growth method. The film thickness of the epitaxial layer 14 is set to, for example, 20 to 60 nm. The epitaxial layers 14 are formed in contact with the upper surface of the silicon layer 3 so as to sandwich the gate electrode 7a, the silicon oxide films 5 and the silicon nitride films 12 on the side walls of the gate electrode 7a. At this time, since the upper surface of the semiconductor substrate 1 of the bulk silicon region 1B is covered with the silicon oxide film 5 and is not exposed in the growth process of the epitaxial layers 14, no epitaxial layer is formed on the upper surface of the semiconductor substrate 1 in the bulk silicon region 1B.

The epitaxial layer 14 is a semiconductor layer having a film thickness larger than that of the gate insulating films 6a and 6b, and is made of, for example, silicon (Si). The epitaxial layer 14 has a dome-like shape whose film thickness is reduced as being closer to the end portion. In other words, the film thickness of the epitaxial layer 14 is larger in the center thereof as compared with the film thickness in the end portion.

Figure 9:
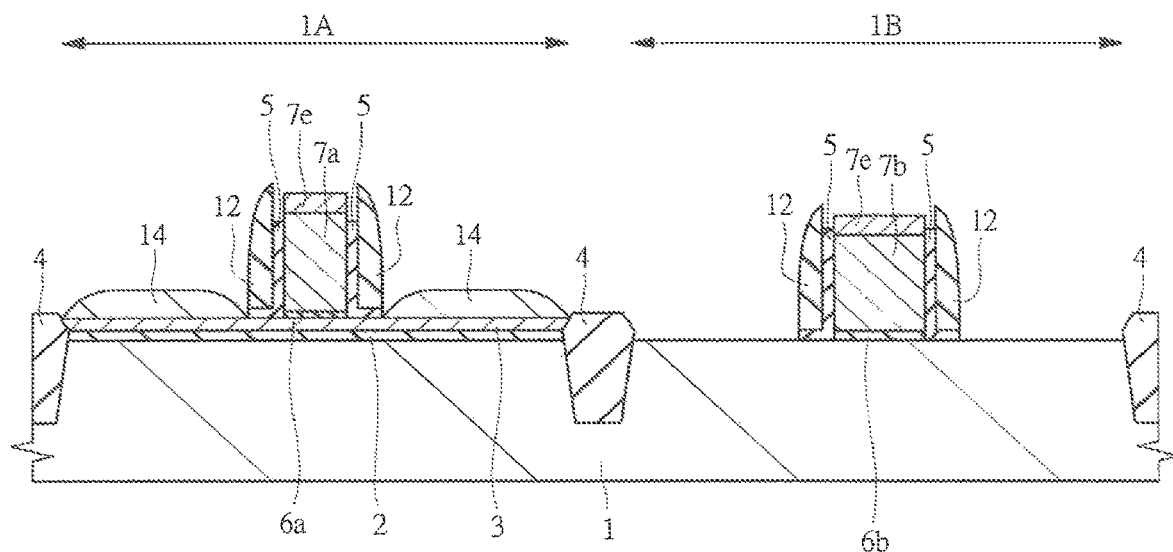
FIG. 9 is a cross-sectional view showing the manufacturing method of the semiconductor device continued from FIG. 8.

Next, as shown in FIG. 9, the silicon oxide film 5 formed in the bulk silicon region 1B is partly removed by using a selective dry etching method. In this manner, the silicon oxide film 5 in the bulk silicon region 1B is left in a region between the gate electrode 7b and the silicon nitride film 12 and in a region between the semiconductor substrate 1 and the silicon nitride film 12, and the upper surface of the semiconductor substrate 1 and the upper surface of the silicon nitride film 7e in the bulk silicon region 1B are exposed. Moreover, by this etching process, the upper portion of the silicon oxide film 5 in the SOI region 1A is also partly removed.

Figure 10:
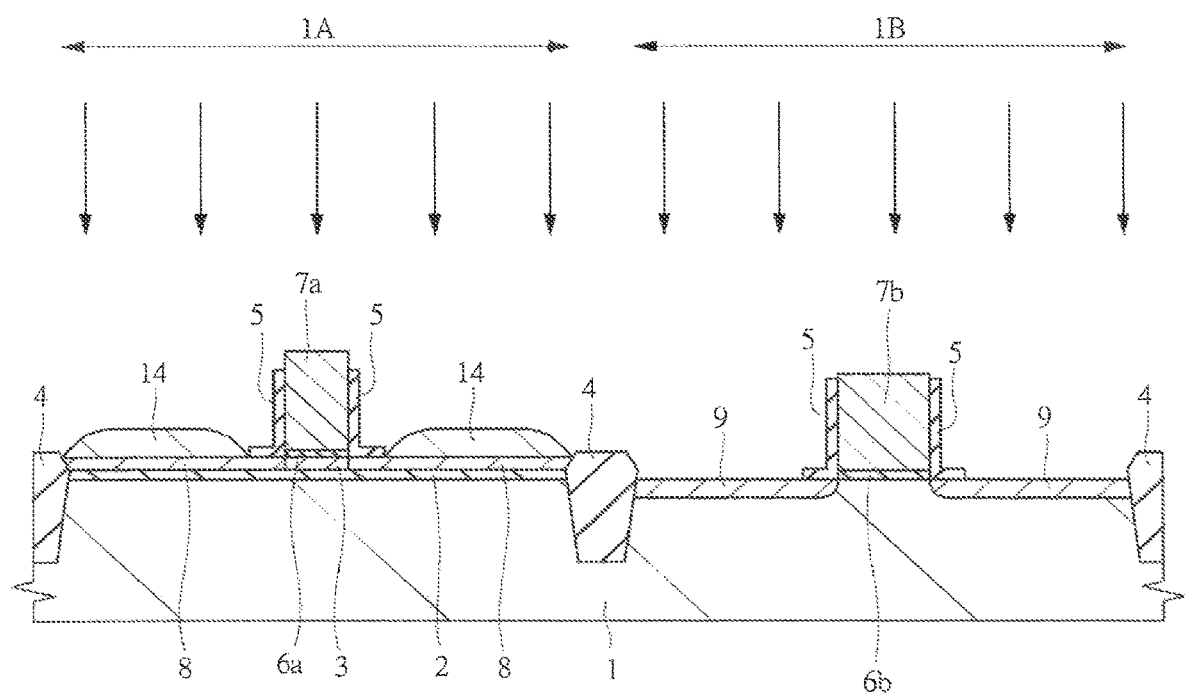
FIG. 10 is a cross-sectional view showing the manufacturing method of the semiconductor device continued from FIG. 9.

Next, as shown in FIG. 10, the silicon nitride films 7e and 12 on the semiconductor substrate 1 are removed by using a selective etching method. Thus, the upper surfaces of the gate electrodes 7a and 7b are exposed, and the surface of the silicon oxide film 5 that was covered with the silicon nitride film 12 is exposed.

Thereafter, by the ion implantation of an n-type impurity such as P (phosphorous) or As (arsenic) into the upper surface of the silicon layer 3 in the SOI region 1A, a pair of extension regions 8, which is n-type semiconductor regions, is formed on the silicon layer 3 except for a part right below the gate electrode 7a. More specifically, in the SOI region 1A, the pair of extension regions 8 is formed on the silicon layer 3 in the regions on the both sides of the gate electrode 7a.

Similarly, by implanting an n-type impurity such as P (phosphorous) or As (arsenic) into the upper surface of the semiconductor substrate 1 in the bulk silicon region 1B, a pair of extension regions 9, which is n-type semiconductor regions, is formed on the upper surface of the semiconductor substrate 1 located on the sides of the gate electrode 7b in the gate length direction. More specifically, in the bulk silicon region 1B, the pair of extension regions 9 is formed on the upper surface of the semiconductor substrate 1 in the regions on the both sides of the gate electrode 7b.

Note that, with respect to the manufacturing processes of the above-mentioned extension regions 8 and 9, either one of these may be carried out first. Moreover, the respective extension regions 8 and 9 may be formed by the same ion implanting process, or may be formed in different processes respectively carried out for the SOI region 1A and the bulk silicon region 1B. In the case of forming the extension regions 8 and 9 in respectively different processes, when forming one of the extension regions, for example, a photoresist film is used as a mask so as to prevent impurity ions from being introduced to a region in which the other extension region is to be formed.

Also, in the present embodiment, as shown in FIG. 10, the extension regions 8 and 9 are formed after the silicon nitride films 7e and 12 have been removed, but the extension regions 8 and 9 may be formed by using an ion implantation method or the like in the process described with reference to FIG. 6 at the time before the formation of the silicon nitride film 12 and after the formation of the silicon oxide film 5.

Figure 11:
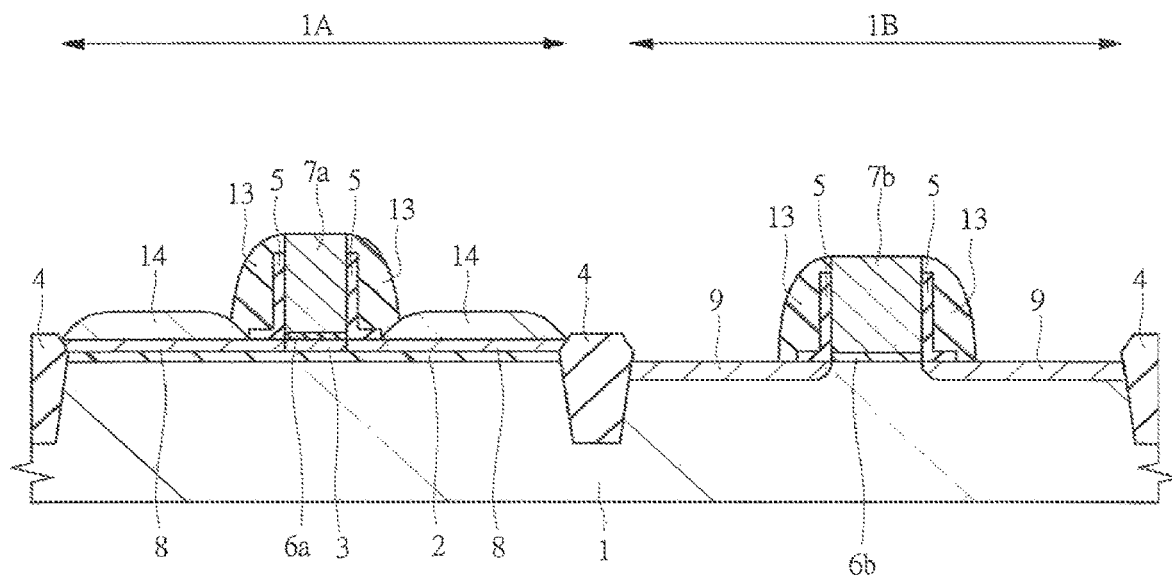
FIG. 11 is a cross-sectional view showing the manufacturing method of the semiconductor device continued from FIG. 10.

Next, as shown in FIG. 11, for example, by using a CVD method, a silicon nitride film 13 having a film thickness of about 40 to 60 nm is formed so as to cover the respective exposed surfaces of the gate electrodes 7a and 7b, the silicon oxide film 5, the epitaxial layers 14, and the semiconductor substrate 1. Thereafter, an anisotropic etching process is carried out by an RIE method or the like so as to partly remove the silicon nitride film 13, thereby exposing the respective upper surfaces of the gate electrodes 7a and 7b, the epitaxial layers 14, and the semiconductor substrate 1. In this manner, the silicon nitride film 13 is formed on each of the side walls of the gate electrodes 7a and 7b in a self-aligned manner via the silicon oxide film 5. A sidewall made up of the silicon oxide film 5 and the silicon nitride film 13 is formed on each of the side walls of the gate electrodes 7a and 7b.

Note that the silicon nitride film 13 is formed so as to cover the silicon oxide film 5. More specifically, at the time when the silicon nitride film 13 is formed by a CVD method or the like in the above-mentioned process, the uppermost surface of the silicon oxide film 5 is positioned at a region lower than the upper surface of the adjacent gate electrode 7a or 7b. Therefore, when the sidewall made up of the silicon nitride film 13 is formed in a self-aligned manner by a dry etching process, the silicon nitride film 13 is in contact with each of the side walls of the gate electrode 7a or 7b at a region above the uppermost surface of the silicon oxide film 5, and also, the silicon nitride film 13 is formed so as to cover the end portion of the silicon oxide film 5 corresponding to the side surface of the end portion located at the farthest position from the adjacent gate electrode 7a or 7b. In this manner, the silicon nitride film 13 is formed so as to cover the end portions of the silicon oxide film 5 corresponding to both of the end portion of the uppermost portion and the end portion at the farthest position from the gate electrode.

At this time, the lower surface of the silicon nitride film 13 in the bulk silicon region 1B is in contact with the upper surfaces of the silicon oxide film 5 and the semiconductor substrate 1, while the lower surface of the silicon nitride film 13 in the SOI region 1A is in contact with the upper surfaces of the silicon oxide film 5 and the epitaxial layer 14. Note that the lower surface of the silicon nitride film 13 in the SOI region 1A is sometimes in contact with the upper surface of the silicon layer 3.

In other words, in the SOI region 1A, the upper surface of the end portion of the epitaxial layer 14 on the side of the gate electrode 7a corresponding to the end portion closer to the gate electrode 7a is covered with the silicon nitride film 13. The film thickness of the end portion of the epitaxial layer 14 is smaller than that of the center of the epitaxial layer 14. Therefore, by the process described with reference to FIG. 11, the state in which one portion of the region of the epitaxial layer 14 having a smaller film thickness is covered with the silicon nitride film 13 is achieved.

Figure 12:
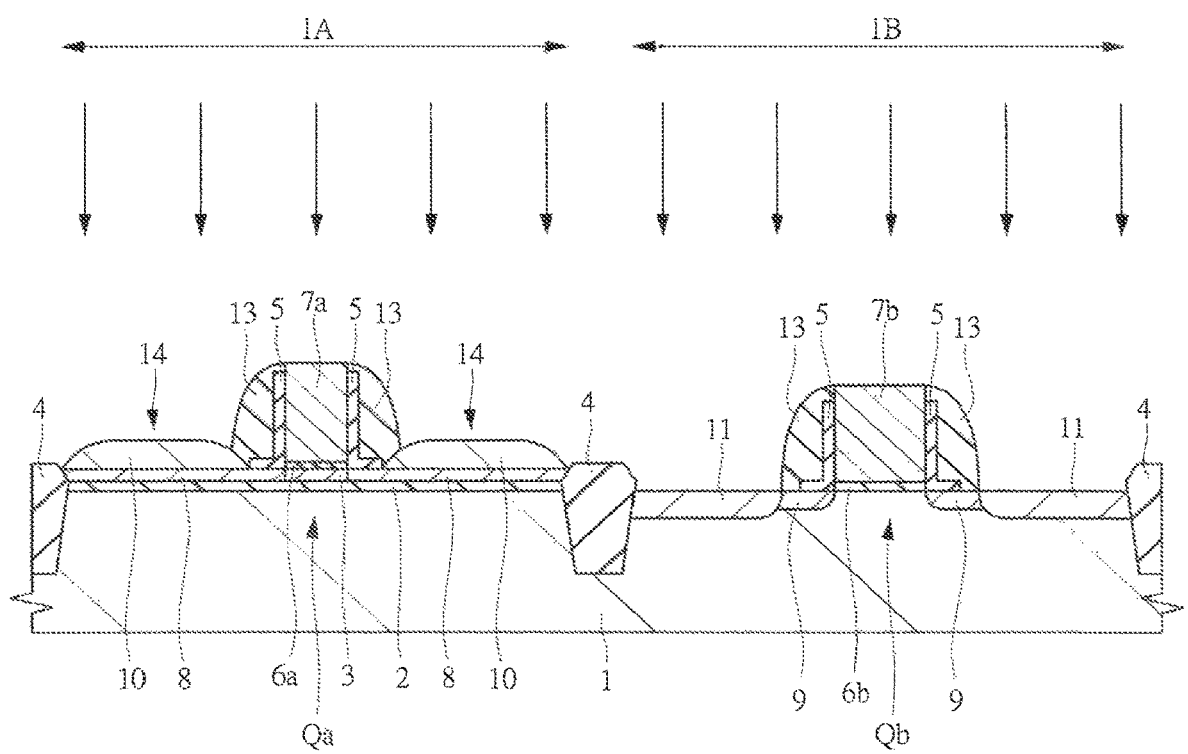
FIG. 12 is a cross-sectional view showing the manufacturing method of the semiconductor device continued from FIG. 11.

Next, as shown in FIG. 12, in the SOI region 1A, an ion implantation process of an n-type impurity (for example, As (arsenic)) is carried out at a comparatively high concentration from above the silicon layer 3, with using the gate electrode 7a and the silicon nitride film 13 as masks. In the SOI region 1A, by implanting an n-type impurity (for example, As (arsenic)) into the epitaxial layer 14 not covered with the gate electrode 7a, the silicon oxide film 5, and the silicon nitride film 13, a diffusion layer 10 is formed. In this manner, in the SOI region 1A, the n channel type MOSFET Qa having a channel region made up of the silicon layer 3, the gate electrode 7a, the extension regions 8, and the diffusion layers 10 is formed. The diffusion layers 10 and the extension regions 8 are semiconductor regions constituting the source and drain regions of the MOSFET Qa in the SOI region 1A.

Moreover, in the bulk silicon region 1B, an ion implantation process of an n-type impurity (for example, As (arsenic)) is carried out at a comparatively high concentration from above the semiconductor substrate 1, with using the gate electrode 7b and the silicon nitride film 13 as masks. In the bulk silicon region 1B, by implanting the n-type impurity (for example, As (arsenic)) into the upper surface of the semiconductor substrate 1 not covered with the gate electrode 7b, the silicon film 5, and the silicon nitride film 13, the diffusion layer 11 is formed. In this manner, in the bulk silicon region 1B, the n channel type MOSFET Qb having a channel region made up of the main surface of the semiconductor substrate 1, the gate electrode 7b, the extension regions 9, and the diffusion layers 11 is formed. The diffusion layers 11 and the extension regions 9 are semiconductor regions constituting the source and drain regions of the MOSFET Qb of the bulk silicon region 1B.

Note that, since the semiconductor layer in a region to which impurity ions are implanted is damaged to be amorphized in the ion implantation for forming the diffusion layers 10 and 11, an annealing (thermal treatment) process at about 1000° C. is carried out for the purpose of recrystallization of the semiconductor layer after the ion implantation.

The source and drain regions of the respective MOSFET Qa and Qb are provided with an LDD (Lightly Doped Drain) structure including the diffusion layers 10 and 11 in which an impurity has been implanted at a high concentration and the extension regions 8 and 9 containing an impurity at a low concentration. Therefore, the impurity concentration of the diffusion layers 10 and 11 is higher than the impurity concentration of the extension regions 8 and 9.

In the process of implanting impurity ions at a high concentration to the semiconductor layer like the process for forming the diffusion layers 10 and 11, the crystallinity of a semiconductor layer to which the impurity ions have been implanted is deteriorated and is amorphized (non-crystallized). It is conceivable that the crystallinity of the amorphized semiconductor layer is recovered by a thermal treatment in the subsequent process so as to be formed into a layer with crystallinity, but in order to recover the crystallinity of the amorphized semiconductor layer, a semiconductor layer serving as a core for the crystallization needs to be located close to the amorphized semiconductor layer. In other words, in the case when no semiconductor layer having crystallinity is located close to the amorphized semiconductor layer, it is difficult to crystallize the amorphized semiconductor layer even when a thermal treatment is carried out.

When the diffusion layer 10 is to be formed in a thin semiconductor layer like the silicon layer 3, the silicon layer 3 is amorphized from the lower surface up to the upper surface due to the small film thickness of the silicon layer 3, with the result that no semiconductor layer having crystallinity remains in the vicinity thereof. Consequently, it becomes difficult to recover from the damage caused by the ion implantation. For this reason, in the SOI region 1A, the epitaxial layers 14 are formed to increase the film thickness of the semiconductor layer to which ions are implanted at the time of forming the diffusion layers 10, thereby preventing the amorphization of the semiconductor layer over the entire thickness due to the ion implantation.

However, in the case when the ion implantation is carried out from above the semiconductor substrate 1, since the film thickness of the end portion of the epitaxial layer 14 is small, the impurity ions are implanted at a high concentration into the bottom portion of the silicon layer 3 right below the end portion of the exposed epitaxial layer 14, with the result that the layer might be damaged and amorphized by the ion implantation. In particular, if damages which cannot be recovered by a thermal treatment remain in the silicon layer 3 right below the end portion of the epitaxial layer 14, that is, the end portion closer to the gate electrode 7a, electrical characteristics of the MOSFET Qa are deteriorated.

In contrast, in the present embodiment, since the end portion of the epitaxial layer 14 closer to the gate electrode 7a is covered with the silicon nitride film (insulating film) 13 constituting the sidewalls in the ion implantation process shown in FIG. 12, it is possible to prevent the silicon layer 3 right below the corresponding end portion from being amorphized and become unrecoverable in crystallinity. Thus, since it is possible to prevent degradation of the electrical characteristics of the MOSFET Qa, performances of the semiconductor device can be improved.

More specifically, in the MOSFET Qa in the SOI region 1A, the upper surface of the source and drain regions is positioned at a region higher than the interface between the gate insulating film 6a and the silicon layer 3. Moreover, in the MOSFET Qb in the bulk silicon region 1B, the upper surface of the source and drain regions is as high as or lower than the interface between the gate insulating film 6b and the semiconductor substrate 1.

Also, as shown in the present embodiment, in the case when the low withstand voltage MOSFET Qa is formed in the SOI region 1A and the high withstand voltage MOSFET Qb is formed in the bulk silicon region 1B, it is conceivable that the gate insulating film 6b having a film thickness larger than that of the gate insulating film 6a formed in the SOI region 1A is formed in the bulk silicon region 1B. In this case, when the thick insulating film made of, for example, a silicon oxide film is etched to form the gate insulating film 6b in the process described with reference to FIG. 5, etching residues from the insulating film tend to remain on the upper surface of the semiconductor substrate 1 in the bulk silicon region 1B due to the large film thickness. When the epitaxial layer is formed on the upper surface of the semiconductor substrate 1 in the state where the residues remain thereon, the epitaxial layer might fail to uniformly grow due to the presence of the residues, with the result that electrical characteristics of the MOSFET Qb shown in FIG. 12 are degraded or varied.

In contrast, in the present embodiment, in the process shown in FIG. 8, the epitaxial layers 14 in the SOI region 1A are formed in the state where the upper surface of the semiconductor substrate 1 in the bulk silicon region 1B is covered with silicon oxide film 5, thereby preventing the epitaxial layer from being formed in the bulk silicon region 1B. Therefore, since it is possible to prevent the above-mentioned degradation of electrical characteristics of the MOSFET Qb and the occurrence of variations of electrical characteristics of the MOSFET Qb, performances of the semiconductor device can be improved.

Moreover, since the epitaxial layer is not formed in the bulk silicon region 1B as described earlier, it is possible to prevent the electrical characteristics of the MOSFET Qb in the bulk silicon region 1B from being changed. Therefore, in the same manner as in the semiconductor device having no SOI structure, the design matters to be used for forming and using a MOSFET including no epitaxial layer having a shape that is raised from the main surface of the substrate in the part of source and drain can be applied to the formation and use of the MOSFET Qb in the bulk silicon region 1B. Consequently, it is possible to reduce manufacturing costs of the semiconductor device.

Figure 13:
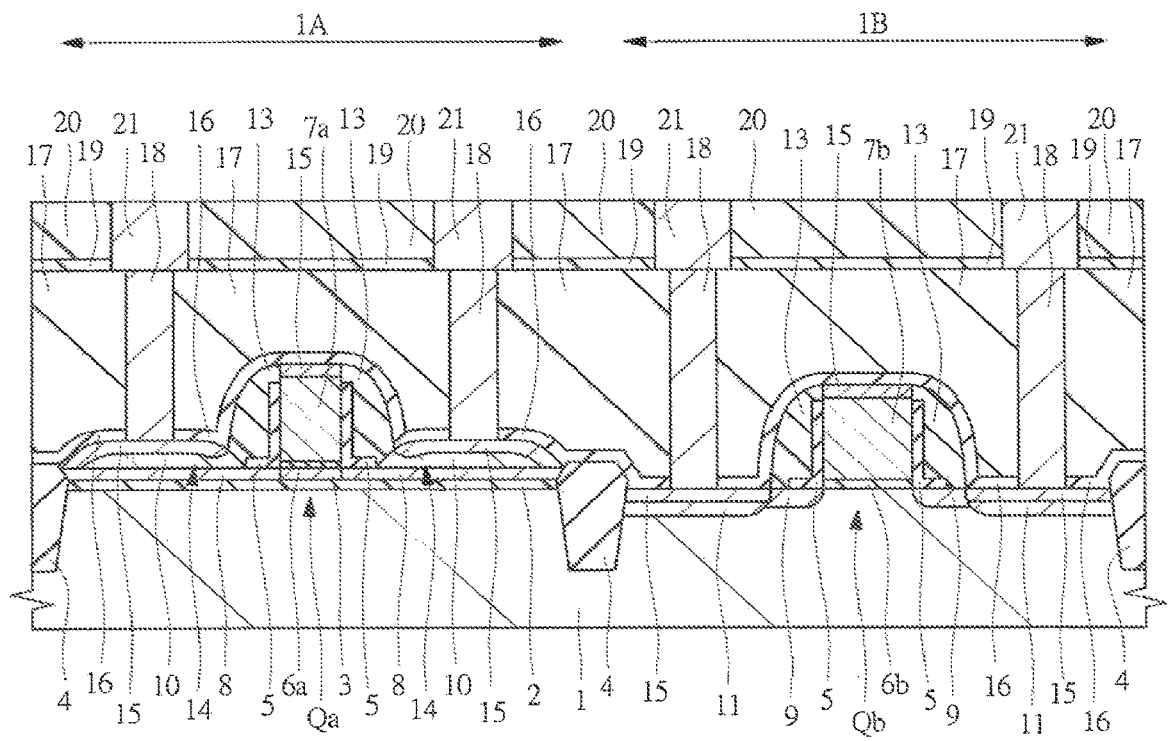
FIG. 13 is a cross-sectional view showing the manufacturing method of the semiconductor device continued from FIG. 12.

Although detailed descriptions and illustrations of the subsequent processes are omitted, after a silicide layer 15 is formed on the gate electrodes 7a and 7b and on the diffusion layers 10 and 11 by using a conventionally known salicide technique, the MOSFETs Qa and Qb are covered with a stacked film made up of the insulating film 16 and the interlayer insulating film 17. Thereafter, contact plugs 18 penetrating the interlayer insulating film 17 and the insulating film 16 are connected to the silicide layer 15. Subsequently, an insulating film 19 and an interlayer insulating film 20 are sequentially formed on the interlayer insulating film 17, and wirings 21 connected to the inside of each of the wiring trenches penetrating the insulating film 19 and the interlayer insulating film 20 and the upper surface of the contact plugs 18 are formed, so that the semiconductor device of the present embodiment shown in FIG. 13 is completed.

Second Embodiment

In the present embodiment, a semiconductor device including a MOSFET formed by a manufacturing method different from that of the first embodiment will be described.

First, the manufacturing processes of a MOSFET according to the present embodiment will be described with reference to drawings. FIGS. 14 to 21 are cross-sectional views showing manufacturing processes of a semiconductor device according to the present embodiment, that is, the semiconductor device provided with an n channel type MOSFET in each of the SOI region and the bulk silicon region.

First, by carrying out the processes described with reference to FIGS. 2 to 5, a gate electrode is formed on a semiconductor substrate in each of the SOI region and the bulk silicon region via a gate insulating film.

Figure 14:
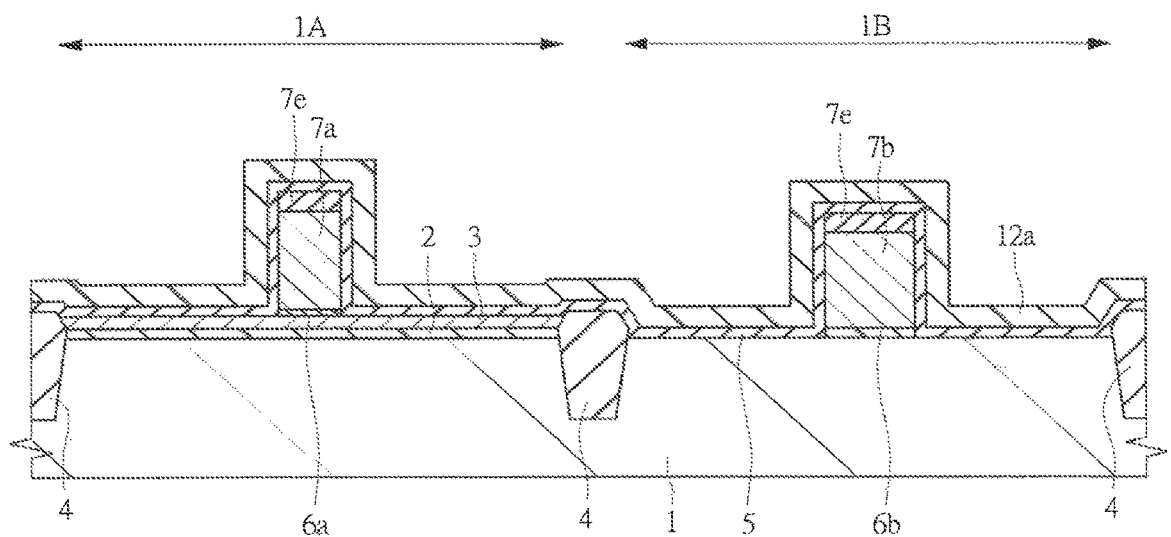
FIG. 14 is a cross-sectional view showing a manufacturing method of a semiconductor device according to the second embodiment of the present invention.

Next, as shown in FIG. 14, by using, for example, a CVD method, a silicon oxide film 5 and a silicon nitride film (insulating film) 12a are formed (deposited) on the entire surface of the semiconductor substrate 1.

Figure 15:
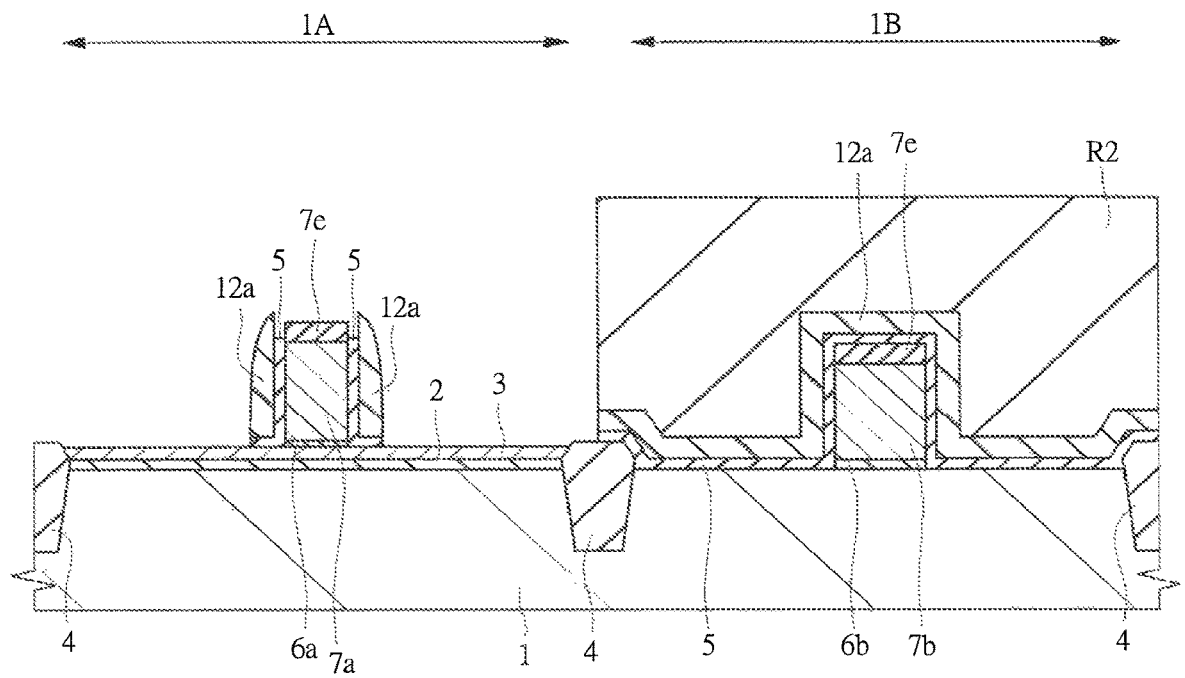
FIG. 15 is a cross-sectional view showing the manufacturing method of the semiconductor device continued from FIG. 14.

Next, as shown in FIG. 15, after the silicon nitride film 12a in the bulk silicon region 1B is covered with a photoresist film R2, the silicon nitride film 12a and the silicon oxide film 5 in the SOI region 1A are processed by using an anisotropic etching method such as an RIE method, thereby exposing the upper surface of the silicon layer 3 and the upper surface of the silicon nitride film 7e. In this manner, the silicon nitride film 12a is formed into a sidewall shape via the silicon oxide film 5 on each of the side walls of the gate electrode 7a in the SOI region 1A. Moreover, the silicon oxide film 5 in the SOI region 1A remains at a region between the gate electrode 7a and the silicon nitride film 12a and at a region between the silicon layer 3 and the silicon nitride film 12a.

Figure 16:
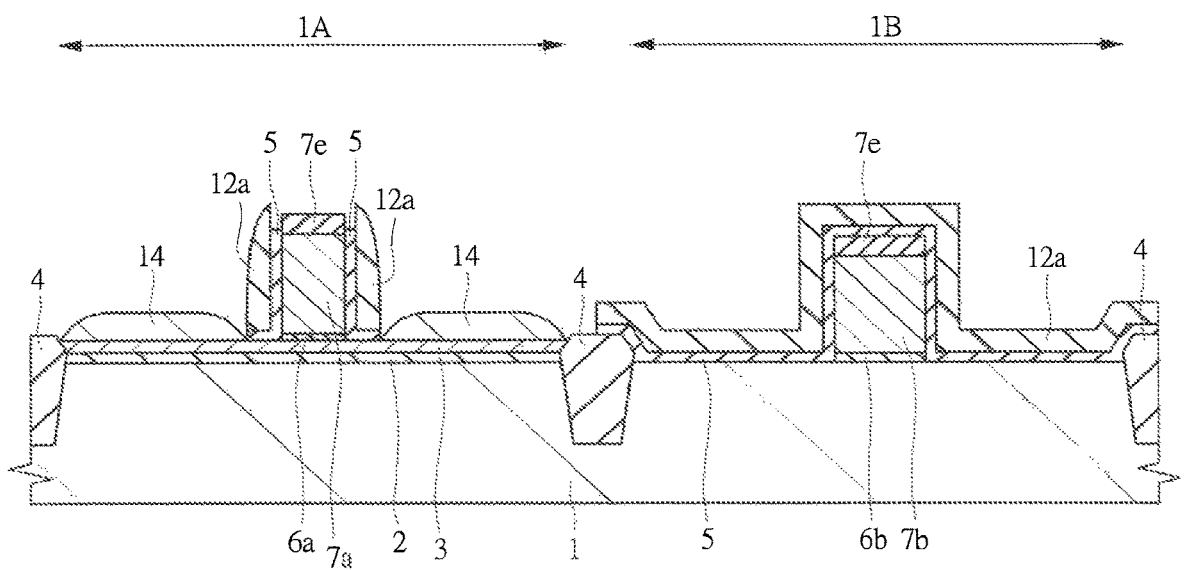
FIG. 16 is a cross-sectional view showing the manufacturing method of the semiconductor device continued from FIG. 15.

Next, as shown in FIG. 16, after the photoresist film R2 is removed by an ashing process, epitaxial layers 14 are formed on the upper surface of the silicon layer 3 exposed on the semiconductor substrate 1 by using an epitaxial growth method. The film thickness of the epitaxial layer 14 is set to, for example, 20 to 60 nm. At this time, since the upper surface of the semiconductor substrate 1 in the bulk silicon region 1B is covered with the silicon oxide film 5 and the silicon nitride film 12a and is not exposed in the growth process of the epitaxial layers 14, no epitaxial layer is formed on the upper surface of the semiconductor substrate 1 in the bulk silicon region 1B.

Figure 17:
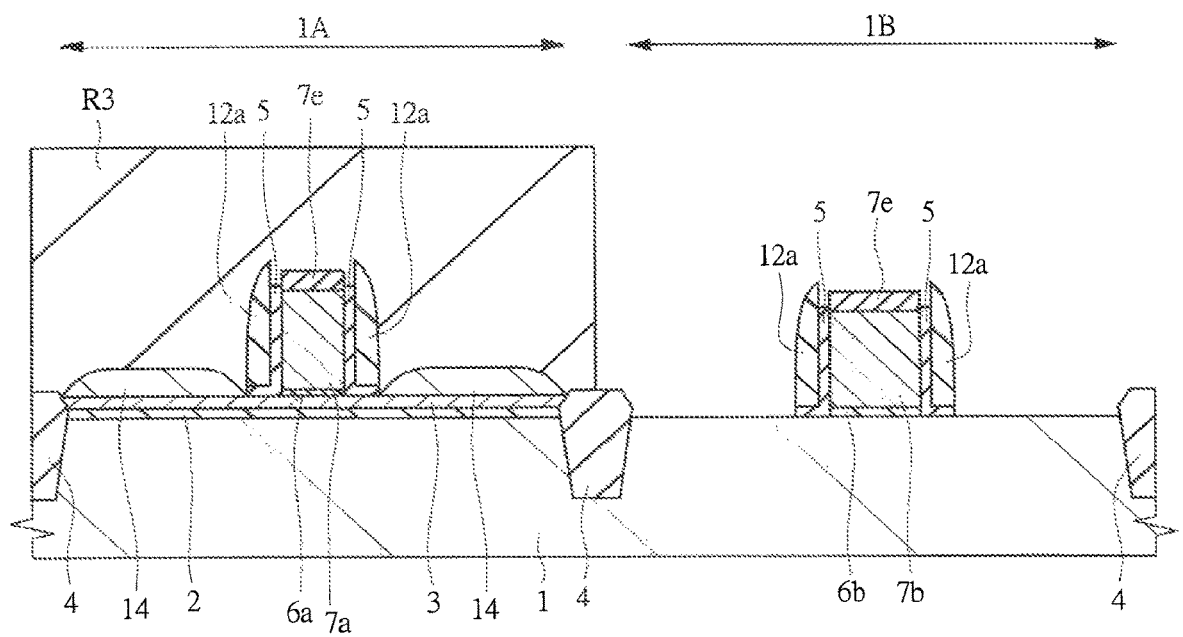
FIG. 17 is a cross-sectional view showing the manufacturing method of the semiconductor device continued from FIG. 16.

Next, as shown in FIG. 17, a photoresist film R3, which covers the silicon layer 3, the gate electrode 7a, the silicon oxide film 5, the silicon nitride film 12a, the epitaxial layers 14, and the silicon nitride film 7e in the SOI region 1A and does not cover the bulk silicon region 1B, is formed.

Thereafter, by carrying out an anisotropic etching process using the RIE method or the like, the silicon nitride film 12a and the silicon oxide film 5 in the bulk silicon region 1B are partly removed, thereby exposing the upper surfaces of the silicon nitride film 7e and the semiconductor substrate 1. In this manner, the silicon nitride film 12a is formed in a self-aligned manner on each side wall of the gate electrode 7b via the silicon oxide film 5. At this time, the epitaxial layers 14 are formed on the both sides of the gate electrode 7a in the SOI region 1A, while no epitaxial layer is formed on the both sides of the gate electrode 7b in the bulk silicon region 1B.

Figure 18:
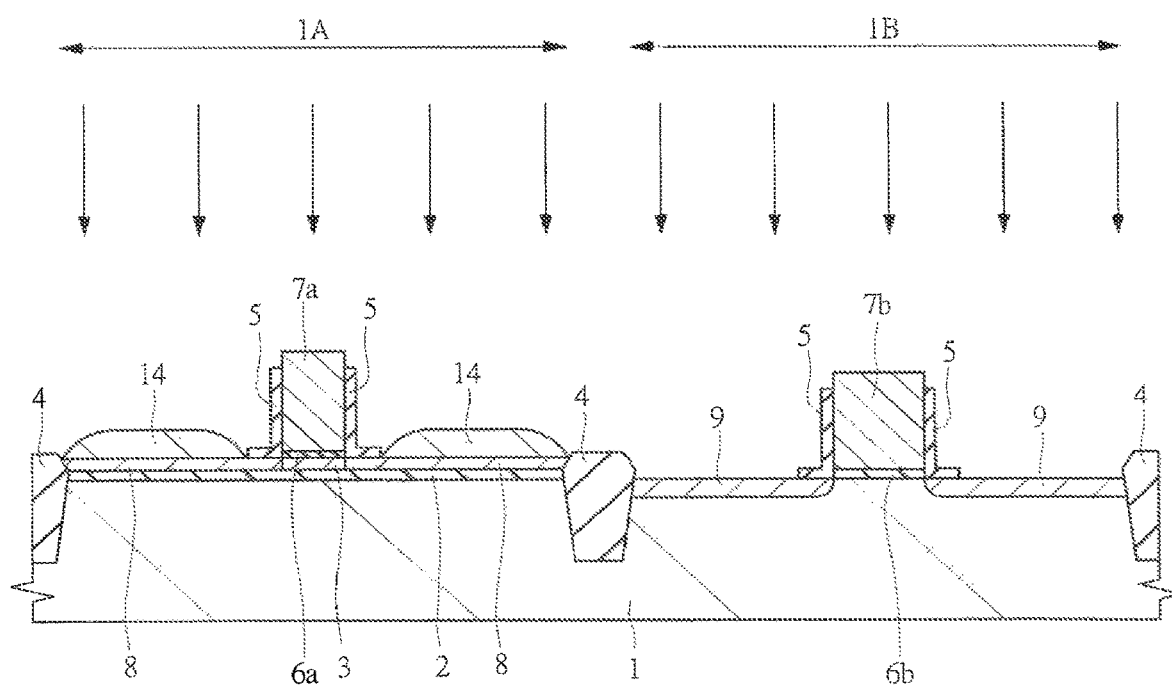
FIG. 18 is a cross-sectional view showing the manufacturing method of the semiconductor device continued from FIG. 17.

Next, as shown in FIG. 18, after the photoresist film R3 is removed by an ashing process, the silicon nitride films 7e and 12a on the semiconductor substrate 1 are removed by a selective etching method using hot phosphoric acid or the like. Thus, the upper surfaces of the gate electrodes 7a and 7b are exposed, and the surface of the silicon oxide film 5 that was covered with the silicon nitride film 12 is exposed.

Thereafter, by the ion implantation of an n-type impurity such as P (phosphorous) or As (arsenic) into the upper surface of the silicon layer 3 in the SOI region 1A, a pair of extension regions 8, which is n⁻-type semiconductor regions, is formed on the silicon layer 3 except for a part right below the gate electrode 7a. More specifically, in the SOI region 1A, the pair of extension regions 8 is formed on the silicon layer 3 in the regions on the both sides of the gate electrode 7a.

Similarly, by implanting an n-type impurity such as P (phosphorous) or As (arsenic) into the upper surface of the semiconductor substrate 1 in the bulk silicon region 1B, a pair of extension regions 9, which is n⁻-type semiconductor regions, is formed on the upper surface of the semiconductor substrate 1 located on the sides of the gate electrode 7b in the gate length direction. More specifically, in the bulk silicon region 1B, the pair of extension regions 9 is formed on the upper surface of the semiconductor substrate 1 in the regions on the both sides of the gate electrode 7b.

Note that, with respect to the manufacturing processes of the above-mentioned extension regions 8 and 9, either one of these may be carried out first. Moreover, the respective extension regions 8 and 9 may be formed by the same ion implanting process, or may be formed in different processes respectively carried out for the SOI region 1A and the bulk silicon region 1B. In the case of forming the extension regions 8 and 9 in respectively different processes, when forming one of the extension regions, for example, a photoresist film is used as a mask so as to prevent impurity ions from being introduced to a region in which the other extension region is to be formed.

Also, in the present embodiment, the extension regions 8 and 9 are formed after the silicon nitride films 7e and 12 have been removed, but the extension regions 8 and 9 may be formed by using an ion implantation method or the like in the process described with reference to FIG. 14 at the time before the formation of the silicon nitride film 12a and after the formation of the silicon oxide film 5.

Figure 19:
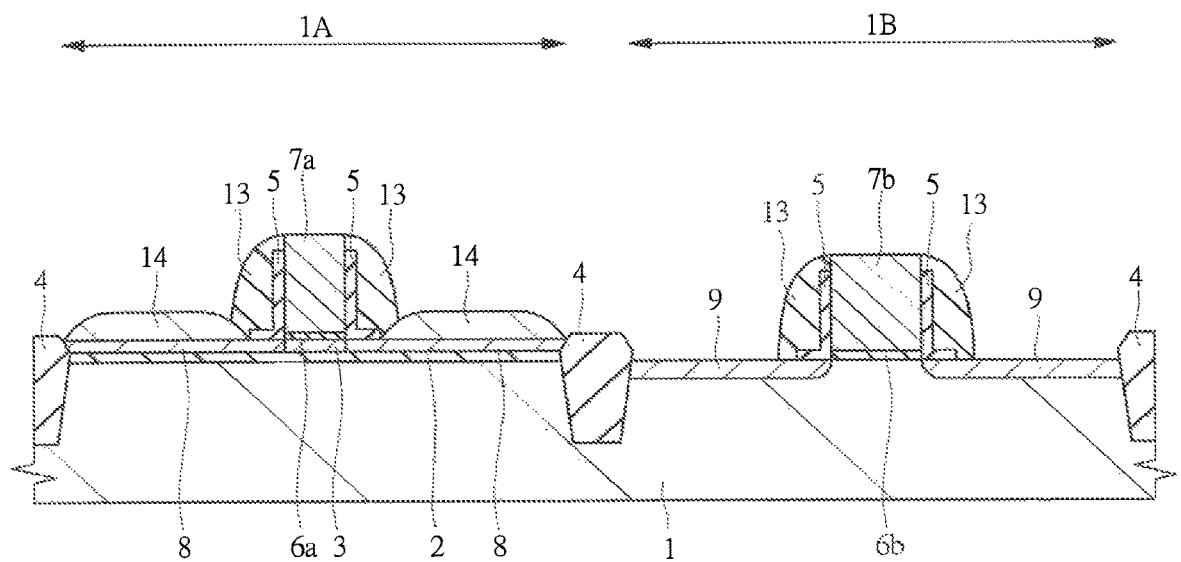
FIG. 19 is a cross-sectional view showing the manufacturing method of the semiconductor device continued from FIG. 18.

Next, by carrying out the same processes as the processes described with reference to FIG. 11, the structure shown in FIG. 19 is obtained. More specifically, as shown in FIG. 19, for example, by using a CVD method, a silicon nitride film 13 having a film thickness of about 40 to 60 nm is formed so as to cover the respective exposed surfaces of the gate electrodes 7a and 7b, the silicon oxide film 5, the epitaxial layers 14, and the semiconductor substrate 1. Thereafter, an anisotropic etching process is carried out by an RIE method or the like so as to partly remove the silicon nitride film 13, thereby exposing the respective upper surfaces of the gate electrodes 7a and 7b, the epitaxial layers 14, and the semiconductor substrate 1. In this manner, the silicon nitride film 13 is formed on each of the side walls of the gate electrodes 7a and 7b in a self-aligned manner via the silicon oxide film 5. At this time, the upper surface of the end portion of the epitaxial layer 14 closer to the gate electrode 7a is covered with the silicon nitride film 13.

Figure 20:
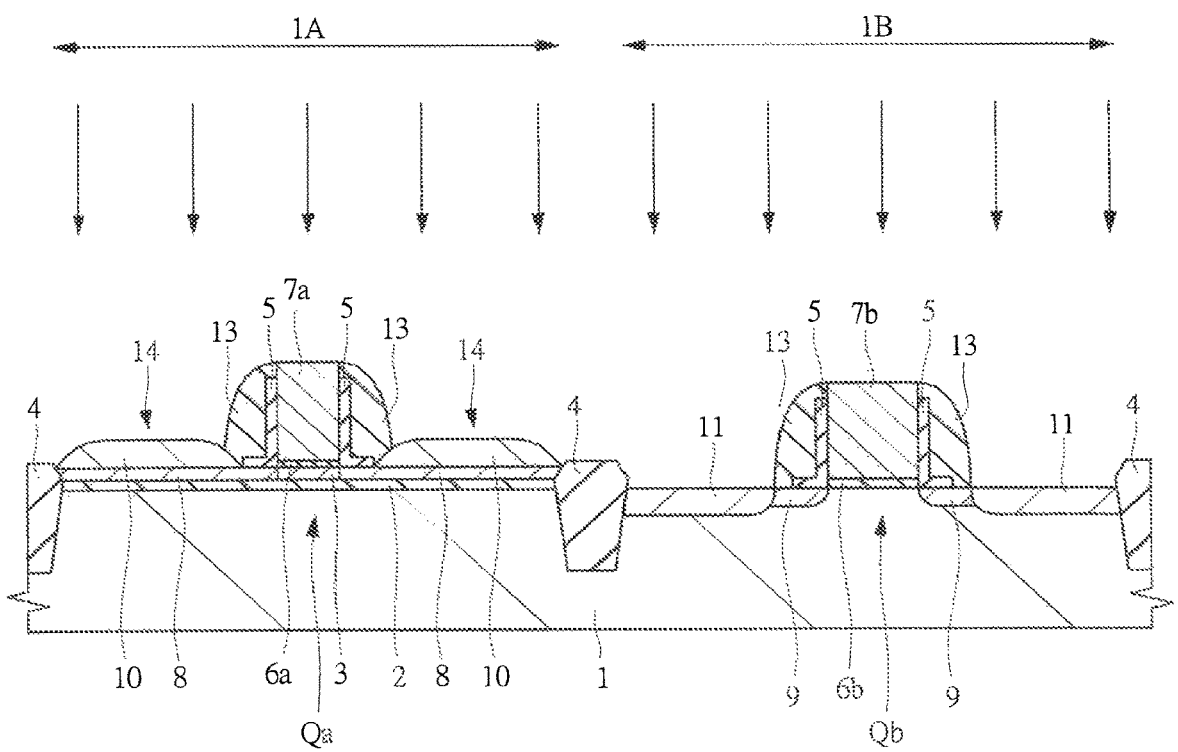
FIG. 20 is a cross-sectional view showing the manufacturing method of the semiconductor device continued from FIG. 19.

Next, by carrying out the same processes as those described with reference to FIG. 12, the structure shown in FIG. 20 is obtained. More specifically, by carrying out an ion implantation process of an n-type impurity (for example, As (arsenic)) at a comparatively high concentration to the SOI region 1A and the bulk silicon region 1B, diffusion layers 10 are formed in the epitaxial layers 14 in the SOI region 1A, and diffusion layers 11 are formed on the upper surface of the semiconductor substrate 1 in the bulk silicon region 1B. In this manner, in the SOI region 1A, the n channel type MOSFET Qa having a channel region made up of the silicon layer 3, the gate electrode 7a, the extension regions 8, and the diffusion layers 10 is formed, and in the bulk silicon region 1B, the n channel type MOSFET Qb having a channel region made up of the main surface of the semiconductor substrate 1, the gate electrode 7b, the extension regions 9, and the diffusion layers 11 is formed.

Figure 21:
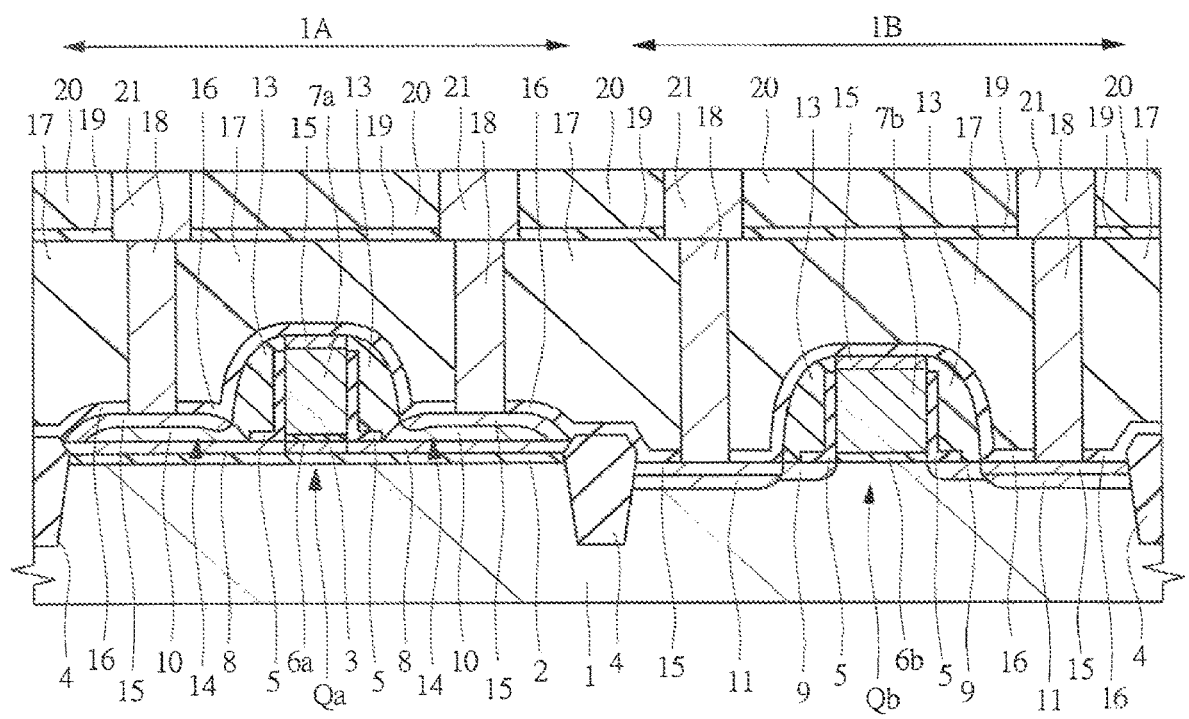
FIG. 21 is a cross-sectional view showing the manufacturing method of the semiconductor device continued from FIG. 20.

With respect to the subsequent processes, the same processes as those described with reference to FIG. 13 are carried out, so that the semiconductor device shown in FIG. 21 is completed.

In the semiconductor device of the present embodiment, in the same manner as in the semiconductor device of the aforementioned first embodiment, the epitaxial layers 14 are formed in the SOI region 1A, and an ion implantation to form the diffusion layers 10 is carried out in the state where the end portions the epitaxial layers 14 are covered. Therefore, it is possible to prevent damages caused by the ion implantation from remaining in the semiconductor layer including the source and drain regions of the MOSFET Qa. In other words, it is possible to prevent a region whose crystallinity is unrecoverable from occurring in the amorphized semiconductor layer. Consequently, since it is possible to prevent the degradation of electrical characteristics of the MOSFET Qa, the performances of the semiconductor device can be improved.

Moreover, in the present embodiment, in the process shown in FIG. 16, the epitaxial layers 14 in the SOT region 1A are formed in the state where the upper surface of the semiconductor substrate 1 in the bulk silicon region 1B is covered with the silicon oxide film 5 and the silicon nitride film 12a, thereby preventing the epitaxial layer from being formed in the bulk silicon region 1B. Consequently, since the epitaxial layer is not formed in the source and drain regions of the MOSFET Qb, it is possible to prevent the degradation of electrical characteristics of the MOSFET Qb and the occurrence of variations in electrical characteristics of the MOSFET Qb, with the result that the performances of the semiconductor device can be improved.

Third Embodiment

Figure 22:
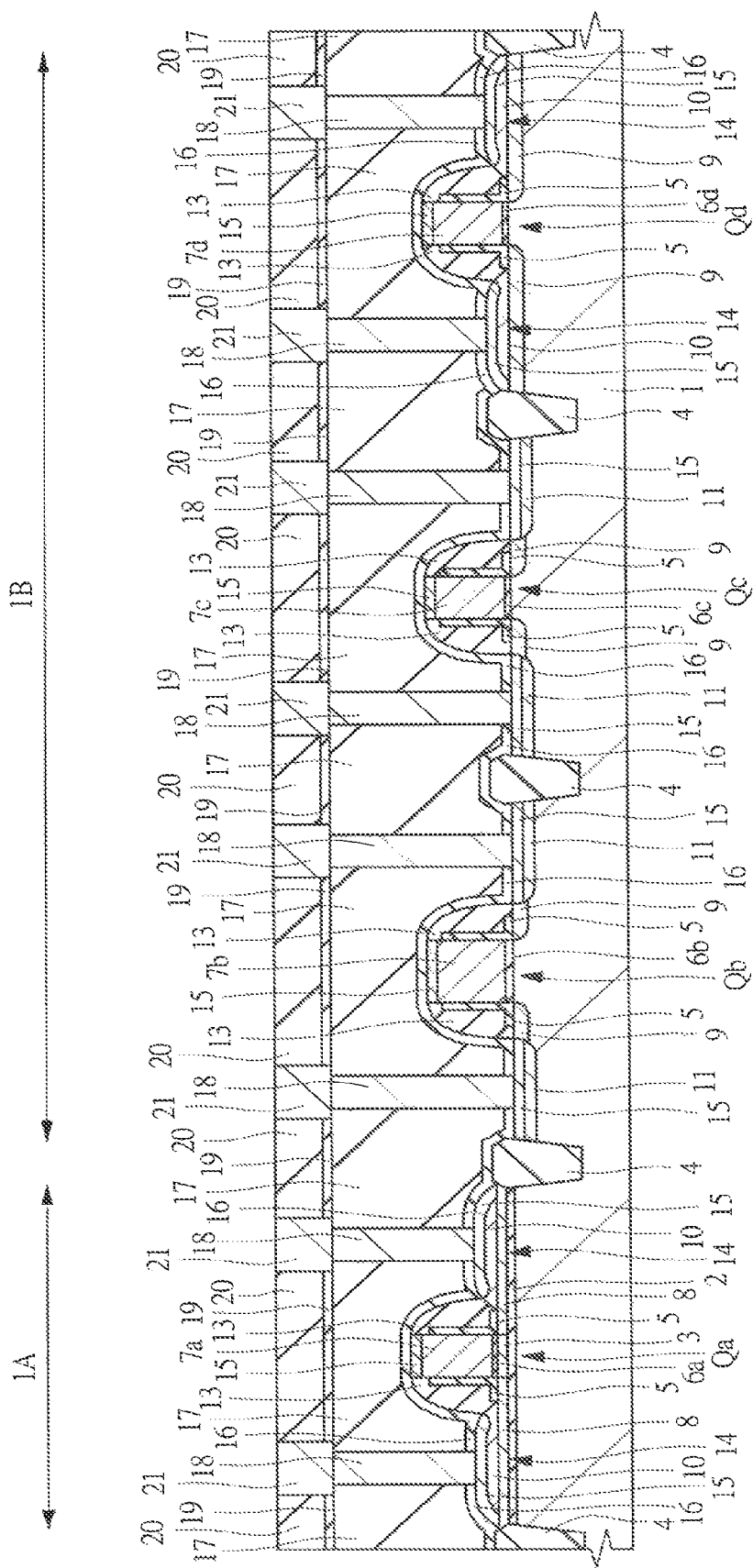
FIG. 22 is a cross-sectional view showing a semiconductor device according to the third embodiment of the present invention.

The present third embodiment will show a structure in which a MOSFET Qc and a MOSFET Qd each having a thin-film gate oxide film are formed also in the bulk silicon region 1B as shown in FIG. 22. In this case, no epitaxial layer 14 is formed in the source and drain regions of the MOSFET Qc, and the epitaxial layers 14 are formed in the source and drain regions of the MOSFET Qd. The MOSFET Qc is provided with a gate insulating film 6c and a gate electrode 7c sequentially formed on the semiconductor substrate 1 in the bulk silicon region 1B. The MOSFET Qd is provided with a gate insulating film 6d and a gate electrode 7d sequentially formed on the semiconductor substrate 1 in the bulk silicon region 1B. The gate insulating films 6c and 6d are thin-film gate oxide films having a film thickness smaller than that of the gate insulating film 6b. In this case, the thin-film gate oxide film has a film thickness of 2 to 3 nm similar to the gate insulating film 6a of the MOSFET Qa. The effects obtained by the present embodiment will be described below.

In the case when a circuit that is designed for use in a semiconductor device made up of only existing bulk MOSFETs is to be directly diverted to a semiconductor device using an SOI substrate like in the case of the present application, it is desirable that the characteristics of the bulk MOSFETs are not altered. For this reason, to portions where no changes in the characteristics of the bulk MOSFET are desired, the MOSFET Qc having no epitaxial layers 14 formed therein is utilized.

On the other hand, in the case when the epitaxial layer 14 is formed, a short channel effect can be suppressed without the necessity of changing the gate length of the MOSFET. For this reason, to portions where the suppression of the short channel effect is desired, the MOSFET Qd is used. By suppressing the short channel effect, it is possible to suppress the off-current.

As described above, the MOSFET Qc in which no epitaxial layer 14 is formed and the MOSFET Qd in which the epitaxial layers 14 are formed are selectively used depending on characteristics required for each of MOSFETs.

At this time, with respect to the manufacturing method of the semiconductor device, the method according to the aforementioned first embodiment or the method according to the aforementioned second embodiment may be used. With respect to the mask as well, those masks used in FIG. 7 or FIG. 15 may be utilized.

Furthermore, if necessary, all the low withstand voltage MOSFETs in the bulk silicon region 1B may be MOSFETs Qc, or all of them may be MOSFETs Qd. Note that, in the case when all the low withstand voltage MOSFETs in the bulk silicon region 1B are the MOSFETs Qc, since no epitaxial layer 14 is formed in the bulk silicon region 1B, it is possible to further improve the reliability of the semiconductor device like in the aforementioned first and second embodiments.

In the aforementioned first and second embodiments, the fact that, in the case when the epitaxial layers 14 are formed in a MOSFET in the bulk silicon region 1B, electrical characteristics tend to fluctuate in comparison with a MOSFET in which no epitaxial layer 14 is formed has been described. However, if it is possible to remove the residues left at the time of the etching of the gate insulating film 6b or if the base epitaxial layers 14 can be uniformly grown at the time of forming the silicide layer 3, the structure of the present embodiment may be adopted.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the above-mentioned first to third embodiments, the case in which n channel type MOSFETs are formed on a semiconductor substrate has been described. However, the semiconductor element may be a p channel type MOSFET or may be a MIS-type FET.

What is claimed is:
1. A semiconductor device comprising:
a first field effect transistor formed at a first region of a semiconductor substrate; and
a second field effect transistor formed at a second region of the semiconductor substrate, the second region being different from the first region,
wherein, in the first region, a first insulating film is formed on the semiconductor substrate, and a semiconductor layer is formed on the first insulating film,
wherein the first field effect transistor has:
a first gate electrode formed on the semiconductor layer via a first gate insulating film;
a second insulating film formed on a side surface of the first gate electrode, and formed on the semiconductor layer;
an epitaxial layer formed on the semiconductor layer, which is not covered with the second insulating film, such that the epitaxial layer has an end portion whose thickness is thinner than a thickness of a central portion thereof;
a third insulating film formed on the side surface of the first gate electrode via the second insulating film such that the third insulating film covers an upper surface of the epitaxial layer in the end portion;

first source and drain regions formed in at least portions of the epitaxial layer located on both sides of the first gate electrode; and first extension regions formed in portions of the semiconductor layer, which are covered with the second insulating film and the third insulating film, and respectively connected with the first source and drain regions, wherein the third insulating film is in contact with a portion of the side surface of the first gate electrode, which is exposed from the second insulating film, wherein the second field effect transistor has:
  a second gate electrode formed on the semiconductor substrate via a second gate insulating film;
  a fourth insulating film formed on a side surface of the second gate electrode, and formed on the semiconductor substrate;
  a fifth insulating film formed on the side surface of the second gate electrode via the fourth insulating film;
  second source and drain regions formed in portions of the semiconductor substrate located on both sides of the second gate electrode; and
  second extension regions formed in portions of the semiconductor substrate, which are covered with the fourth insulating film and the fifth insulating film, and respectively connected with the second source and drain regions, wherein a thickness of the second gate insulating film of the second field effect transistor is greater than a thickness of the first gate insulating film of the first field effect transistor, and wherein the first extension regions are formed in the portions of the semiconductor layer, which are covered with the end portion of the epitaxial layer, the second insulating film and the third insulating film.

2. The semiconductor device according to claim 1, further comprising:
  an element separation portion formed by burying a sixth insulating film in the semiconductor substrate,
  wherein an element separation region including the element separation portion is situated between the first region and the second region.

3. The semiconductor device according to claim 1, further comprising:
  an interlayer insulating film formed so as to cover the first field effect transistor and the second field effect transistor;
  first metal wirings formed on the interlayer insulating film; and
  second metal wirings formed on the interlayer insulating film,
  wherein each distance from the portions of the epitaxial layer, in which the first source and drain regions of the first field effect transistor are respectively formed, to the first metal wirings is less than each distance from the portions of the semiconductor substrate, in which the second source and drain regions of the second field effect transistor are respectively formed, to the second metal wirings.

4. The semiconductor device according to claim 3, further comprising:
  first contact plugs connecting the portions of the epitaxial layer with the first metal wirings, respectively; and
  second contact plugs connecting the portions of the semiconductor substrate with the second metal wirings, respectively.

5. The semiconductor device according to claim 1, wherein, in cross-sectional view, an upper surface of the semiconductor layer in the first region is positioned higher than an upper surface of the semiconductor substrate in the second region.

6. The semiconductor device according to claim 1, wherein an epitaxial layer is not formed on the semiconductor substrate in which the second source and drain regions of the second field effect transistor are respectively formed.

7. The semiconductor device according to claim 1, wherein the central portion of the epitaxial layer, which is not covered with the third insulating film, has an impurity concentration that is higher than an impurity concentration of each of the first extension regions, and wherein the end portion of the epitaxial layer, which is covered with the third insulating film, has an impurity concentration that is lower than the impurity concentration of the central portion of the epitaxial layer.

8. The semiconductor device according to claim 7, wherein the second insulating film is comprised of silicon oxide, and wherein the third insulating film is comprised of silicon nitride.

9. The semiconductor device according to claim 8, wherein a thickness of the first insulating film is 10 to 20 nm, and wherein a thickness of the semiconductor layer is 10 to 20 nm.

10. The semiconductor device according to claim 7, wherein the end portion of the epitaxial layer, which is covered with the third insulating film, has an impurity concentration that is lower than an impurity concentration of each of the first source and drain regions, and wherein a region of the epitaxial layer, which is not covered with the third insulating film, has an impurity concentration that is higher than the impurity concentration of each of the first extension regions.

11. The semiconductor device according to claim 10, wherein an upper surface of the region of the epitaxial layer, which is not covered with the third insulating film, is covered with a silicide layer.

12. The semiconductor device according to claim 11, wherein the silicide layer is made of nickel silicide.

13. A semiconductor device comprising:
  a first field effect transistor formed at a first region of a semiconductor substrate; and
  a second field effect transistor formed at a second region of the semiconductor substrate, the second region being different from the first region,
  wherein, in the first region, a first insulating film is formed on the semiconductor substrate, and a semiconductor layer is formed on the first insulating film,
  wherein the first field effect transistor has:
    a first gate electrode formed on the semiconductor layer via a first gate insulating film;
    a second insulating film formed on a side surface of the first gate electrode, and formed on the semiconductor layer;
    an epitaxial layer formed on the semiconductor layer, which is not covered with the second insulating film, such that the epitaxial layer has an end portion whose thickness is thinner than a thickness of a central portion thereof;
    a third insulating film formed on the side surface of the first gate electrode via the second insulating film such that the third insulating film covers an upper surface of the epitaxial layer in the end portion;
a first diffusion layer formed in at least a portion of the epitaxial layer, the first diffusion layer being to be served as a part of one of a source region of the first field effect transistor and a drain region of the first field effect transistor; and
a first extension region formed in a portion of the semiconductor layer, which is covered with the second insulating film and the third insulating film, and connected with the first diffusion layer, the first extension region being to be served as a part of the one of the source region of the first field effect transistor and the drain region of the first field effect transistor,
wherein the third insulating film is in contact with a portion of the side surface of the first gate electrode, which is exposed from the second insulating film,
wherein an impurity concentration of the first diffusion layer is higher than an impurity concentration of the first extension region,
wherein the second field effect transistor has:
a second gate electrode formed on the semiconductor substrate via a second gate insulating film;
a fourth insulating film formed on a side surface of the second gate electrode, and formed on the semiconductor substrate;
a fifth insulating film formed on the side surface of the second gate electrode via the fourth insulating film;
a second diffusion layer formed in a portion of the semiconductor substrate, the second diffusion layer being to be served as a part of one of a source region of the second field effect transistor and a drain region of the second field effect transistor; and
a second extension region formed in a portion of the semiconductor substrate, which is covered with the fourth insulating film and the fifth insulating film, and connected with the second diffusion layer, the second extension region being to be served as a part of the one of the source region of the second field effect transistor and the drain region of the second field effect transistor,
wherein an impurity concentration of the second diffusion layer is higher than an impurity concentration of the second extension region,
wherein a thickness of the second gate insulating film of the second field effect transistor is greater than a thickness of the first gate insulating film of the first field effect transistor, and
wherein the first extension region is formed in the portion of the semiconductor layer, which is covered with the end portion of the epitaxial layer, the second insulating film and the third insulating film.

14. The semiconductor device according to claim 13, further comprising:
an element separation portion formed by burying a sixth insulating film in the semiconductor substrate,
wherein an element separation region including the element separation portion is situated between the first region and the second region.

15. The semiconductor device according to claim 13, further comprising:
an interlayer insulating film formed so as to cover the first field effect transistor and the second field effect transistor;
a first metal wiring formed on the interlayer insulating film; and
a second metal wiring formed on the interlayer insulating film,
wherein a distance from the portion of the epitaxial layer, in which the first diffusion layer is formed, to the first metal wiring is less than a distance from the portion of the semiconductor substrate, in which the second diffusion layer is formed, to the second metal wiring.

16. The semiconductor device according to claim 15, further comprising:
a first contact plug connecting the portion of the epitaxial layer with the first metal wiring; and
a second contact plug connecting the portion of the semiconductor substrate with the second metal wiring.

17. The semiconductor device according to claim 13, wherein, in cross-sectional view, an upper surface of the semiconductor layer in the first region is positioned higher than an upper surface of the semiconductor substrate in the second region.

18. The semiconductor device according to claim 13, wherein an epitaxial layer is not formed on the semiconductor substrate in which the second diffusion layer is formed.

19. The semiconductor device according to claim 13, wherein the central portion of the epitaxial layer, which is not covered with the third insulating film, has an impurity concentration that is higher than an impurity concentration of the first extension region, and
wherein the end portion of the epitaxial layer, which is covered with the third insulating film, has an impurity concentration that is lower than the impurity concentration of the central portion of the epitaxial layer.

20. The semiconductor device according to claim 19, wherein the second insulating film is comprised of silicon oxide, and
wherein the third insulating film is comprised of silicon nitride.

21. The semiconductor device according to claim 20, wherein a thickness of the first insulating film is 10 to 20 nm, and
wherein a thickness of the semiconductor layer is 10 to 20 nm.

22. The semiconductor device according to claim 19, wherein the end portion of the epitaxial layer, which is covered with the third insulating film, has an impurity concentration that is lower than an impurity concentration of the first diffusion layer, and
wherein a region of the epitaxial layer, which is not covered with the third insulating film, has an impurity concentration that is higher than the impurity concentration of the first extension region.

23. The semiconductor device according to claim 22, wherein an upper surface of the region of the epitaxial layer, which is not covered with the third insulating film, is covered with a silicide layer.

24. The semiconductor device according to claim 23, wherein the silicide layer is made of nickel silicide.

25. A semiconductor device comprising:
a first field effect transistor formed at a first region of a semiconductor substrate,
wherein, in the first region, a first insulating film is formed on the semiconductor substrate, and a semiconductor layer is formed on the first insulating film,
wherein the first field effect transistor has:
a first gate electrode formed on the semiconductor layer via a first gate insulating film;

a second insulating film formed on a side surface of the first gate electrode, and formed on the semiconductor layer;

an epitaxial layer formed on the semiconductor layer, which is not covered with the second insulating film, such that the epitaxial layer has an end portion whose thickness is thinner than a thickness of a central portion thereof;

a third insulating film formed on the side surface of the first gate electrode via the second insulating film such that the third insulating film covers an upper surface of the epitaxial layer in the end portion;

a first diffusion layer formed in at least a portion of the epitaxial layer, the first diffusion layer being to be served as a part of one of a source region of the first field effect transistor and a drain region of the first field effect transistor; and a first extension region formed in a portion of the semiconductor layer, which is covered with the second insulating film and the third insulating film, and connected with the first diffusion layer, the first extension region being to be served as a part of the one of the source region of the first field effect transistor and the drain region of the first field effect transistor, wherein the third insulating film is in contact with a portion of the side surface of the first gate electrode, which is exposed from the second insulating film, wherein an impurity concentration of the first diffusion layer is higher than an impurity concentration of the first extension region, and wherein the first extension region is formed in the portion of the semiconductor layer, which is covered with the end portion of the epitaxial layer, the second insulating film and the third insulating film.

26. The semiconductor device according to claim 25,
wherein the central portion of the epitaxial layer, which is not covered with the third insulating film, has an impurity concentration that is higher than an impurity concentration of the first extension region, and
wherein the end portion of the epitaxial layer, which is covered with the third insulating film, has an impurity concentration that is lower than the impurity concentration of the central portion of the epitaxial layer.

27. The semiconductor device according to claim 26,
wherein the second insulating film is comprised of silicon oxide, and
wherein the third insulating film is comprised of silicon nitride.

28. The semiconductor device according to claim 27,
wherein a thickness of the first insulating film is 10 to 20 nm, and
wherein a thickness of the semiconductor layer is 10 to 20 nm.

29. The semiconductor device according to claim 26,
wherein the end portion of the epitaxial layer, which is covered with the third insulating film, has an impurity concentration that is lower than an impurity concentration of the first diffusion layer, and
wherein a region of the epitaxial layer, which is not covered with the third insulating film, has an impurity concentration that is higher than the impurity concentration of the first extension region.

30. The semiconductor device according to claim 29,
wherein an upper surface of the region of the epitaxial layer, which is not covered with the third insulating film, is covered with a silicide layer.

31. The semiconductor device according to claim 30,
wherein the silicide layer is made of nickel silicide.

* * * * *